US010824351B2

(12) United States Patent
Satyarthi et al.

(10) Patent No.: US 10,824,351 B2
(45) Date of Patent: Nov. 3, 2020

(54) METHOD AND SYSTEM TO PREVENT FALSE RESTORATION AND PROTECTION IN OPTICAL NETWORKS

(71) Applicant: Infinera Corp., Annapolis Junction, MD (US)

(72) Inventors: Nikhil Kumar Satyarthi, Bangalore (IN); Amit Satbhaiya, Kunadalahalli (IN); Sanjeev Ramachandran, Manipal (IN); Rajan Rao, Fremont, CA (US); Baranidhar Ramanathan, Karnataka (IN)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 15/999,201

(22) Filed: Aug. 17, 2018

(65) Prior Publication Data
US 2019/0007131 A1 Jan. 3, 2019

Related U.S. Application Data

(60) Provisional application No. 62/527,329, filed on Jun. 30, 2017.

(51) Int. Cl.
*H04B 10/08* (2006.01)
*G06F 3/06* (2006.01)
(Continued)

(52) U.S. Cl.
CPC .......... *G06F 3/0625* (2013.01); *G06F 3/0679* (2013.01); *G11C 5/147* (2013.01); *G11C 11/4074* (2013.01); *G11C 16/12* (2013.01); *G11C 16/30* (2013.01); *H04B 10/03* (2013.01); *H04B 10/27* (2013.01); *H04J 14/0228* (2013.01); *H04J 14/0268* (2013.01)

(58) Field of Classification Search
CPC .... H04B 10/03; H04B 10/032; H04B 10/035; H04B 10/038; H04B 10/27; H04Q 11/0003; H04Q 11/0005; H04Q 11/0066; H04Q 11/0062; H04J 14/0267; H04J 14/0212; H04J 14/0257; H04J 14/0228; H04J 14/0268; H04J 14/0221; H04L 45/22; H04L 45/12
USPC ........ 398/2, 3, 4, 5, 7, 8, 10, 13, 17, 22, 23, 398/24, 25, 33, 38, 45, 48, 58, 59, 19, 79, 398/83, 50, 49, 53, 57; 370/216, 217, 370/221, 225, 228, 254
See application file for complete search history.

(56) References Cited

U.S. PATENT DOCUMENTS

2009/0190466 A1* 7/2009 Girardi ............... H04L 41/0681
370/216
2015/0334004 A1* 11/2015 Hussain ............. H04Q 11/0003
398/5

* cited by examiner

*Primary Examiner* — Hanh Phan
(74) *Attorney, Agent, or Firm* — David L. Soltz

(57) ABSTRACT

Systems and methods are described in which circuitry of a first controller of a first node receives a first signal indicating an optical loss of signal within the first path. Circuitry of a second controller of the first node on the first path within a transport network generates a second signal indicating a failure within the first path. The first controller accessing a network topology database determines that restoration of the first path would be ineffective due to there being no alternate path, and signals a second node downstream in the first path with the second signal indicating the failure within the first path, and a third signal indicating that restoration of the first path would be ineffective due to there being no alternate path.

23 Claims, 19 Drawing Sheets

(51) Int. Cl.
*G11C 11/4074* (2006.01)
*G11C 16/30* (2006.01)
*G11C 5/14* (2006.01)
*G11C 16/12* (2006.01)
*H04B 10/03* (2013.01)
*H04B 10/27* (2013.01)
*H04J 14/02* (2006.01)

AT EXPRESS NE

AT EXPRESS NE

AT ADD NE

METHOD AND SYSTEM TO PREVENT FALSE RESTORATION AND PROTECTION IN OPTICAL NETWORKS

CROSS-REFERENCE TO RELATED APPLICATIONS

The present patent application claims priority to the provisional patent application identified by U.S. Ser. No. 62/547,329 titled "A Method and System to Prevent False Restoration and Protection in Optical Networks" filed on Aug. 17, 2017, the entire content of which is hereby incorporated herein by reference.

FIELD OF THE DISCLOSURE

The disclosure generally relates to methods and apparatuses for preventing false recovery in optical networks using a controller at a node that generates fault indications for a failure where restoration or protection would be in-effective, and prevents sending false fault indications until an optical switch fabric of the node has at least substantially completed a ramp-up process in which optical signals have sufficient power to carry data traffic to a downstream node.

BACKGROUND

An Optical Transport Network (OTN) is comprised of a plurality of switch nodes linked together to form a network. The OTN includes a data layer, a digital layer, and an optical layer. The optical layer contains multiple sub-layers. OTN structure, architecture, and modeling are further described in the International Telecommunication Union recommendations, including ITU-T G.709, ITU-T G.872, and ITU-T G.805, which are well known in the art. In general, the OTN is a combination of the benefits of SONET/SDH technology and dense wavelength-division multiplexing (DWDM) technology (optics).

The construction and operation of switch nodes (also referred to as "nodes") in the OTN is well known in the art. In general, the nodes of an OTN are generally provided with a control module, input interface(s) and output interface(s). The control modules of the nodes in the OTN function together to aid in the control and management of the OTN. The control modules can run a variety of protocols for conducting the control and management (i.e. Operation, Administration and Maintenance—referred to as OAM) of the OTN. One prominent protocol is referred to in the art as Generalized Multiprotocol Label Switching (GMPLS).

Generalized Multiprotocol Label Switching (GMPLS) is a type of protocol which extends multiprotocol label switching (MPLS) to encompass network schemes based upon time-division multiplexing (e.g. SONET/SDH, PDH, G.709), wavelength multiplexing, and spatial switching (e.g. incoming port or fiber to outgoing port or fiber). Multiplexing is when two or more signals or bit streams are transferred over a common channel.

Wave-division multiplexing is a type of multiplexing in which two or more optical carrier signals are multiplexed onto a single optical fiber by using different wavelengths (that is, colors) of laser light.

Generalized Multiprotocol Label Switching (GMPLS) includes multiple types of label switched paths including protection and recovery mechanisms which specify (1) working connections within a network having multiple nodes and communication links for transmitting data between a headend node and a tailend node; and (2) protecting connections specifying a different group of nodes and/or communication links for transmitting data between the headend node to the tailend node in the event that one or more of the working connections fail. Working connections may also be referred to as working paths. Protecting connections may also be referred to as recovery paths and/or protecting paths and/or protection paths. A first node of a path may be referred to as a headend node or a source node. A last node of a path may be referred to as a tailend node, end node or destination node. The headend node or tailend node initially selects to receive data over the working connection and, if a working connection fails, the headend node or tailend node may select a protecting connection for passing data within the network. The set up and activation of the protecting connections may be referred to as restoration or protection.

Lightpaths are optical connections carried over a wavelength, end to end, from a source node to a destination node in an optical transport network (OTN). Typically, the lightpaths pass through intermediate links and intermediate nodes in the OTN. At the intermediate nodes, the lightpaths may be routed and switched from one intermediate link to another intermediate link. In some cases, lightpaths may be converted from one wavelength to another wavelength at the intermediate nodes.

As previously mentioned, optical transport networks (OTN) have multiple layers including a data packet layer, a digital layer, and an optical layer (also referred to as a photonic layer). The data and digital layers include an opticalchannel transport unit (OTU) sub-layer and an optical channel data unit (ODU) sub-layer. The optical layer has multiple sub-layers, including the Optical Channel (OCh) layer, the Optical Multiplex Section (OMS) layer, and the Optical Transmission Section (OTS) layer. The optical layer provides optical connections, also referred to as optical channels or lightpaths, to other layers, such as the electronic layer. The optical layer performs multiple functions, such as monitoring network performance, multiplexing wavelengths, and switching and routing wavelengths. The Optical Channel (OCh) layer manages end-to-end routing of the lightpaths through the optical transport network (OTN). The Optical Multiplex Section (OMS) layer network provides the transport of optical channels through an optical multiplex section trail between access points. The Optical Transmission Section (OTS) layer network provides for the transport of an optical multiplex section through an optical transmission section trail between access points. The OCh layer, the OMS layer, and the OTS layer have overhead which may be used for management purposes. The overhead may be transported in an Optical Supervisory Channel (OSC).

The Optical Supervisory Channel (OSC) is an additional wavelength that is adapted to carry information about the network and may be used for management functions. The OSC is carried on a different wavelength than wavelengths carrying actual data traffic. Typically, the OSC is used hop-by-hop and is terminated and restarted at every node.

The International Telecommunications Union (ITU) recommendation ITU-T G.709 further defines the OTS, OMS and OCh layers and recommends use of the OSC to carry overhead corresponding to the layers. Additionally, ITU-T recommendation G.872 specifies defects for the OTS, OMS, and OCh layers as well as specifying Operation, Administration & Maintenance (OAM) requirements.

ITU-T recommendations suggest that the OSC utilize a Synchronous Transport Signal (STS) Optical Carrier transmission rate OC-3. Optical Carrier transmission rates are a standardized set of specifications of transmission bandwidth for digital signals that can be carried on fiber optic networks. The OC-3 frame contains three column-interleaved STS Level 1 (STS-1) frames; therefore, the line overhead consists of an array of six rows by nine columns (that is, bytes). The OC-3 frame format is further defined in Telecordia's Generic Requirements GR-253, "Synchronous Optical Network Common Generic Criteria," Issue 4. The OC-3 frame format contains a transport overhead portion. Within the transport overhead portion, bytes designated as D4, D5, D6, D7, D8, D9, D10, D11, and D12 are defined by GR-253 for use by Data Communication Channel (DCC).

The patent application identified by U.S. Ser. No. 13/452, 413, titled "OPTICAL LAYER STATUS EXCHANGE OVER OSC—OAM METHOD FOR ROADM NETWORKS" filed on Apr. 20, 2012, discloses methods for supporting OAM functions for the optical layers, for example, for carrying defect information and overhead in the OSC. The application discloses methodology and apparatuses for supporting OAM functions such as continuity, connectivity, and signal quality supervision for optical layers. The methodology discloses mapping optical layer overhead OAM information to specific overhead bits and assigning the overhead bits to specific OSC overhead bytes. This provides reliable exchange of overhead bytes over OSC between nodes.

Within a DWDM optical networking system, each network element typically consists of an optical switch fabric, i.e., a Wavelength Selective Switch or a Multi Cast Switch which is used to make connections between an input port and an output port of the network element, resulting in connecting two trail end-points with the network element. Optical switch fabrics use a gradual smooth ramp process to initiate a connection of the light flow across the optical switch fabric from the input port of the network element to the output port of the network element. This is in contrast to a digital switch fabric, such as an ODU (Optical Data Unit) fabric in OTN networks or a VC (Virtual Connection) fabric in SDH networks, which results in flow of the data through the digital switch fabric instantaneously. A typical process of setting a connection in an optical switch fabric involves—configuration of the pass-band of the super-channel in the optical switch fabric followed by the gradual smooth ramp process where the connection or the light flow across the fabric is slowly brought up. This can involve a step wise power control that shapes the power profile of the super-channel's spectrum to avoid abrupt behavior in downstream optical network elements. This gradual smooth ramp process with shaping facilitates proper coherent detection on the light sink. Furthermore, to avoid leakage of noise in failure scenarios such as upstream fiber cuts, etc. and to avoid leaking a large amount of power post upstream failure rectification, the entire connection in the optical switch fabric is torn-down in the optical network on upstream failure conditions. Until the ramp in the optical switch fabric is complete, the downstream failure indications are sent which convey to the downstream that the optical channel is not up. There are many forms of failure indications, such as Open Connection Indication (OCI), Forward Defect Indication (FDI or FDI-P) and Lock (LCK). Conventional optical switch fabrics have a controller which implements the ramp process associated with the connection and pass-band state of the optical switch fabric. Additionally, the network element determines which type of fault indication to transmit downstream. This can be accomplished by a Wavelength Selective Switch controller.

In a second level of processing with respect to fault indications, network elements conduct a local determination of optical signal integrity with inputs from various patch cabling points and/or upstream Optical Supervisory Channel signals (on an express network element). This is accomplished with a local photo-diode or an optical measuring device. The local determination results in another form of signal known in the art as Optical Loss of Signal (OLOS) clear/declare. The results of the second level of processing are consolidated with the first level of processing (WSS controller) and its deduced fault indications (FDI or OCI or LCK). Based on the consolidation, a final deduced signaling indication is determined and sent downstream through the Optical Supervisory Channel. The second level of processing is generally required to distinguish whether there is a failure at the source (ROUTING card input) meaning that the optical path cannot be restored. In cases of failure at the source, a special Client Signal Failure (CSF) indication may also be sent downstream in the Optical Supervisory Channel. This is required because unlike certain types of fault indications, such as FDI/OCI/LCK, a fault indication indicating a Client Signal Failure means that the traffic cannot be restored. Thus, receipt of a Client Signal Failure indication by a downstream network element does not result in a restoration or protection trigger. Client Signal Failure indications help in decision making taken by the restoration or protection mechanism by isolating restorable failure cases from non-restorable failure cases (described in depth in detail in the following sections). In case of failure conditions which manifest in Client Signal Failure, the failure is at the source itself and there is no alternate path available to restore the traffic. Hence, the restoration or protection mechanism will decide not to switch to an alternate path in such cases.

Conventional first and second levels of processing can result in false restoration triggers by downstream network elements. Typically, false restoration triggers can arise when the failure at the source is rectified, leading to clear of the Client Signal Failure indication but other fault indications such as Forward Defect Indication-Path or Open Connection Indication are signaled downstream alone with Client Signal Failure. This may indicate that there is a restorable failure condition in the upstream and thereby trigger false restoration. In such cases the purpose of a Client Signal Failure indication sent at the time of failure at the source to prevent false restoration is lost all-together in the first place post the rectification of the failure at the source.

Therefore, a need exists to prevent false restoration in optical transport networks. It is to such an improved method and system that the present disclosure is directed.

SUMMARY

Method and optical nodes are disclosed. The problems caused by false restoration after a failure at the source has been cured is fixed by waiting until a pending WSS ramp process has completed before sending a CSF clear indication further downstream. This helps in preventing false restoration. In philosophy, for an original failure condition which resulted in tearing down the WSS connections in the link in the first place, following recovery is taken into account and sending CSF clear in OSC is avoided until that time. In short, the current disclosure synchronizes CSF handling together with the optical fabric ramp process and chooses not to keep them independent as is done in the prior art.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

Figure 1:
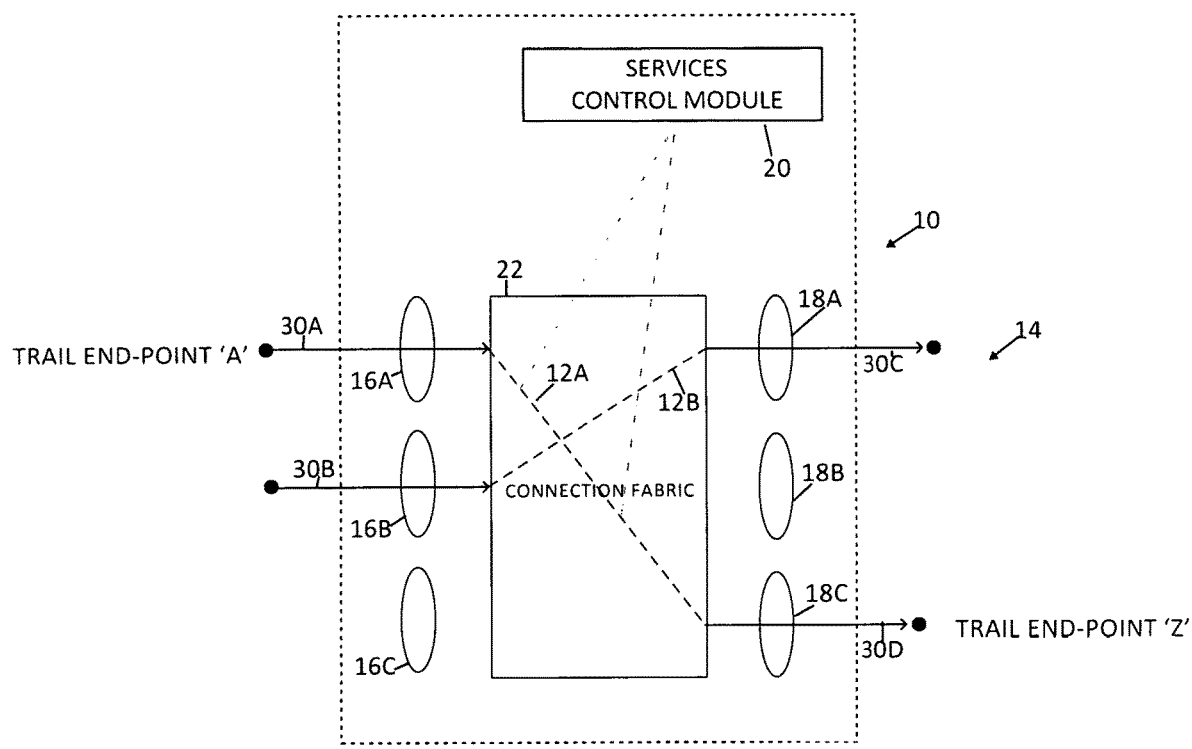
FIG. 1 is a partial illustration of an exemplary node within an optical transport network in accordance with the present disclosure describing concepts within the optical transport network including services, fiber ports/interfaces, an optical switch, and physical connections within the optical switch directing data traffic from trail end point A to trail end point Z.

The following detailed description refers to the accompanying drawings. The same reference numbers in different drawings may identify the same or similar elements.

The disclosure generally relates to methods and apparatuses for preventing false recovery in optical networks using a controller at a node that generates fault indications for a failure where restoration or protection would be in-effective, and prevents sending false fault indications until an optical switch fabric of the node has at least substantially completed a ramp-up process in which optical signals have sufficient power to carry data traffic to a downstream node.

Definitions

If used throughout the description and the drawings, the following short terms have the following meanings unless otherwise stated:

Band: The complete optical spectrum carried on the optical fiber. Depending on the fiber used and the supported spectrum which can be carried over long distances with the current technology, relevant examples of the same are: C-Band/L-Band/Extended-C-Band.

Slice: In an N GHz (N=12.5, 6.25, 3.125) spaced frequency band of the whole of the optical spectrum each such constituent band is called a slice. In one embodiment, a slice is the resolution at which the power levels can be measured by the optical monitoring device. The power level being measured by the optical monitoring device represents the total optical power carried by the band represented by that slice. A super-channel pass-band is composed of a set of contiguous slices.

CSF: (Client Signal Fail)—is a signal sourced by the add node at the head-end to signal the downstream nodes in an optical network that there is a failure at the source. It is used to prevent false protection and restoration.

FDI—Forward Defect Indication; and FDI-P (Forward Defect Indication Path) are signals sent downstream as an indication that an upstream defect has been detected. This is similar to AIS (Alarm Indication Signal) used in SONET/SDH.

OCI—Open Connection Indication is a signal to indicate that a particular OTN interface is not connected to an upstream signal.

LCK—Lock. It's a signal transmitted to the downstream to indicate that the traffic has been brought down intentionally by the user through some external command for some maintenance activity in the network.

LS (Light source): A card where the digital transport client is mapped/de-mapped to/from an optical channel. This is the place where the optical channel originates/terminates.

OAM (Operations Administration Maintenance): A standardized terminology in transport networks used to monitor and manage the network.

OA (Optical Amplifier): A band control gain element generally EDFA or RAMAN based.

ODU—Optical Data Unit

OLDP (Optical Layer Defect Propagation): A fault propagation mechanism in the optical layer for OAM considerations and to facilitate protection or restoration using the overhead frames mapped to an OSC.

OLOS—Optical Loss of Signal

OPM (Optical Power Monitor device): A device having a capability to monitor power on a particular part of the spectrum on a per slice basis.

OSC (Optical Supervisory Channel): This is an additional wavelength usually outside the amplification band (at 1510 nm, 1620 nm, 1310 nm or another proprietary wavelength). The OSC carries information about the multi-wavelength optical signal as well as remote conditions at the optical add/drop or OA sites. It is used for OAM in DWDM networks. It is the multi-wavelength analogue to SONET's DCC (or supervisory channel).

NMS—Network Management System

PD (Photo-Diode): A device which can measure the power levels in the complete band.

Power Control: The algorithm run in the power control domain to measure the optical parameters and do the power adjustments to meet the target power level.

ROADM: Reconfigurable optical add drop multiplexer.

SCH (Super Channel/Optical Channel): A group of wavelengths sufficiently spaced so as not to cause any interference among themselves which are sourced from a single light source including multiple lasers, each of which supplying light at a corresponding wavelength, and managed as a single grouped entity for routing and signaling in an optical network.

Soak or Soaking: Delaying an action to be taken in response to a condition for a time period. If the condition exists at the end of the time period, then action is taken.

VOA—Variable Optical Attenuator

VC—Virtual Container

WSS (Wavelength Selective Switch): A component used in optical communications networks to route (switch) optical signals between optical fibers on a per-slice basis. Generally power level controls can also be done by the WSS by specifying an attenuation level on a pass-band. It's a programmable device where the source and destination fiber ports and associated attenuation can be specified for a pass-band.

WSS ramp process: The WSS in the mux or de-mux direction in a ROADM card is generally controlled by some kind of automatic control loop mechanism to account for losses, equipment aging and change of power at the source. A typical ramp process generally involves associating the tributary input port of the WSS with the line port or vice-versa so that light can flow from the input port to the line port in mux direction or the line port to the tributary port in the de-mux direction respectively, setting the attenuation in the WSS device step-wise in a phased manner to gradually launch the optimal power value out of the egress port and shaping up the power spectrum of the super-channel by fine tuning the spectral slices of the WSS. Until such a process is complete, the optical data path can't be deemed to be up with respect to assuming the traffic path to be healthy enough to be considered for restoration or protection switch.

Description

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more and the singular also includes the plural unless it is obvious that it is meant otherwise.

Throughout this application, the term "about" is used to indicate that a value includes the inherent variation of error for the quantifying device, the method being employed to determine the value, or the variation that exists among the study subjects. For example, but not by way of limitation, when the term "about" is utilized, the designated value may vary by plus or minus twelve percent, or eleven percent, or ten percent, or nine percent, or eight percent, or seven percent, or six percent, or five percent, or four percent, or three percent, or two percent, or one percent.

The use of the term "at least one" or "one or more" will be understood to include one as well as any quantity more than one, including but not limited to, 1, 2, 3, 4, 5, 10, 15, 20, 30, 40, 50, 100, etc. The term "at least one" or "one or more" may extend up to 100 or 1000 or more depending on the term to which it is attached. In addition, the quantities of 100/1000 are not to be considered limiting, as lower or higher limits may also produce satisfactory results.

In addition, the use of the phrase "at least one of X, V, and Z" will be understood to include X alone, V alone, and Z alone, as well as any combination of X, V, and Z.

The use of ordinal number terminology (i.e., "first", "second", "third", "fourth", etc.) is solely for the purpose of differentiating between two or more items and, unless explicitly stated otherwise, is not meant to imply any sequence or order or importance to one item over another or any order of addition.

As used herein, any reference to "one embodiment," "an embodiment," "some embodiments," "one example," "for example," or "an example" means that a particular element, feature, structure, or characteristic described in connection with the embodiment is included in at least one embodiment. The appearance of the phrase "in some embodiments" or "one example" in various places in the specification is not necessarily all referring to the same embodiment, for example.

In accordance with the present disclosure, messages, e.g., fault indications, transmitted between nodes can be processed by circuitry within the input interface(s), and/or the output interface(s) and/or a node controller, such as an optical supervisory channel controller discussed below. Circuitry could be analog and/or digital, components, or one or more suitably programmed microprocessors and associated hardware and software, or hardwired logic. Also, certain portions of the implementations have been described as "components" that perform one or more functions. The term "component," may include hardware, such as a processor, an application specific integrated circuit (ASIC), or a field programmable gate array (FPGA), or a combination of hardware and software. Software includes one or more computer executable instructions that when executed by one or more component cause the component to perform a specified function. It should be understood that the algorithms described herein are stored on one or more non-transitory memory. Exemplary non-transitory memory includes random access memory, read only memory, flash memory or the like. Such non-transitory memory can be electrically based or optically based. Further, the messages described herein may be generated by the components and result in various physical transformations. Additionally, it should be understood that the node can be implemented in a variety of manners as is well known in the art.

Referring now to the drawings, and in particular to FIG. 1, shown therein is a partial schematic diagram of a node 10 constructed in accordance with the present disclosure providing services 12A and 12B in a transport network 14. To assist in providing the service 12A, the node 10 is configured to transport data from trailend point 'A' to trailend point 'Z'. The transport network may conform to the requirements set forth as per the definitions of ITU-T G.705 for transport network architectural components.

As will be discussed in more detail below, the node 10 is adapted to facilitate the communication of data (which may be referred to herein as "traffic") between multiple nodes 10 in the transport network 14. The node 10 is provided with one or more input interfaces 16 (three input interfaces 16A, 16B, and 16C being depicted in FIG. 1 by way of example), one or more output interfaces 18 (three output interfaces 18A, 18B, and 18C being depicted in FIG. 1 by way of example), a control module 20, and an optical switch 22. The input interfaces 16 are also referred to herein as a tributary input port, or ingress port. The output interfaces 18 are also referred to herein as tributary output port or egress port.

In general, the input interfaces 16A, 16B, and 16C are adapted to receive traffic from the transport network 14, and the output interfaces 18A, 18B, and 18C are adapted to transmit traffic onto the transport network 14. The optical switch 22 serves to communicate the traffic from the input interface(s) 16A, 16B, and 16C, to the output interface(s) 18A, 18B, and 18C to provide the services 12A and 12B, for example. And, the control module 20 serves to control the operations of the input interfaces 16A, 16B, and 16C, the output interfaces 18A, 18B, and 18C, and the switch 22.

The control module 20 may run GMPLS and can be referred to herein as a "control plane." The control plane may use GMPLS protocols to setup one or more working paths and one or more protecting paths during a negotiation. During the negotiation between the control planes of the nodes 10 within the transport network 14, labels may be allocated for in-band signaling as part of the GMPLS processing, for example, as will be appreciated by persons of ordinary skill in the art having the benefit of the instant disclosure.

The node 10 can be implemented in a variety of manners, including commercial installations having one or more backplanes (not shown), racks, and the like. In this example, the input interfaces 16, the output interfaces 18, the control module 20 and the switch 22 are typically implemented as separate devices, which may have their own power supply, local memory and processing equipment. In another example, the node 10 can be implemented as a single device having a shared power supply, memory and processing equipment. Or, in another example, the node 10 can be implemented in a modular manner in which the input interfaces 16, the output interfaces 18, the control module 20 and the switch 22 share a power supply and/or housing.

The input interfaces 16, and the output interfaces 18 of one node 10 are adapted to communicate with corresponding input interfaces 16, and output interfaces 18 of another node 10 within the transport network 14 via a communication links 30A, 30B, 30C, and 30D (as shown in FIG. 1). The communication links 30A, 30B, 30C, and 30D may be fiber optic cables. An example of the input interface 16 and/or the output interface 18 is an Ethernet card or optical port. In general, each of the input interfaces 16 and/or the output interfaces 18 may have a unique logical identification, such as an IP address. The implementation of the input interfaces 16, and the output interfaces 18 will depend upon the particular type of communication link 30A, 30B, 30C, and 30D that the particular input interface 16 and/or output interface 18 is designed to communicate with.

In accordance with the present disclosure, messages transmitted between the nodes 10, can be processed by circuitry within the input interface(s) 16, and/or the output interface(s) 18 and/or the control module 20. Circuitry could be analog and/or digital, components, or one or more suitably programmed microprocessors and associated hardware and software, or hardwired logic. Also, certain portions of the implementations have been described as "components" that perform one or more functions. The term "component," may include hardware, such as a processor, an application specific integrated circuit (ASIC), or a field programmable gate array (FPGA), or a combination of hardware and software. Software includes one or more computer executable instructions that when executed by one or more component cause the component to perform a specified function. It should be understood that the algorithms described herein are stored on one or more nontransient or non-transitory memory. Exemplary non-transitory memory includes random access memory, read only memory, flash memory or the like. Such non-transitory memory can be electrically based or optically based. Further, the messages described herein may be generated by the components and result in various physical transformations.

As discussed above, transport network elements, e.g., the node 10, involve service provisioning through a north bound entity—NMS or GMPLS or some other distributed control plane mechanism handling dynamic service provisioning. A service provisioning involves association of two trails as end-points which can be implemented by configuring the optical switch 22 through device settings in the connection fabric. In the transport network 14, the trail entity involved may be a super-channel which is a part of the optical spectrum which carries the digital transport client information converted into light spanning a particular spectrum through some kind of modulation. The optical switch 22 can be implemented as a wavelength selective switch, or in some cases a MCS device.

Figure 2:
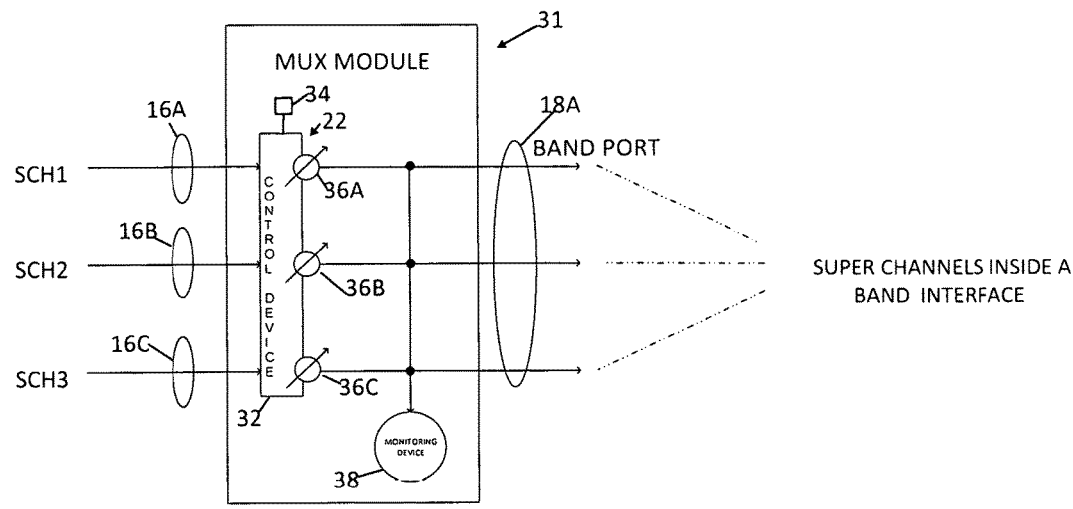
FIG. 2 is another partial illustration of the exemplary node in which the optical switch includes a multiplexer module configured to multiplex a group of super channels to an output port, referred to as a "band port". The multiplexer module of the optical switch includes power control points to configure attenuation to control a launch power of the super channels at the band port.

FIG. 2 depicts an optical device 31, e.g., a card, which is configured to multiplex groups of optical signals (referred to herein as super-channels) provided by the input interfaces 16A, 16B, and 16C to the output interface 18A. The optical device 31 may be implemented as the optical switch 22, which in this example can be a wavelength selective switch 32 having a control device 34 with power control points 36A, 36B, and 36C. The power control points 36A, 36B, and 36C are used to control the light eventually being launched onto the output interface 18 (which is referred to in this example as the "band port." The optical device 31 is also provided with a power monitoring device 38. In general, the control device 34 includes an automatic control loop mechanism to account for losses, equipment aging and change of power at the source. The control device 34 is also provided with instructions to implement a ramp process that generally involves setting a first power level at a first instant of time, and increasing the power level to a second power level at a second instant of time with the second power level being greater than the first power level, and the second power level of the optical signals being sufficient to carry data traffic in an optical fiber from the node 10 to another node 10 in the transport network 14. This can be accomplished by setting the attenuation in the wavelength selective switch 32 with the power control points 36A, 36B, and 36C step-wise in a phased manner and monitoring the power levels with the power monitoring device 38 to gradually launch the optimal power value out of the output interface 18A and shaping the power spectrum of the super-channel by fine tuning the spectral slices of the wavelength selective switch 32. Until such a process is complete, the optical data path cannot be deemed to be up with respect to assuming the traffic path to be healthy enough to be considered for restoration or protection switch.

In modules where the optical switch 22 is the wavelength selective switch 32 used to make associations across the input interfaces 16 and the output interface 18, e.g., the band ports, the same wavelength selective switch 32 provides an option (implemented via the power control points 36A, 36B, and 36C and monitored by the power monitoring device 38) to configure attenuation to control the launch power of the optical signals, e.g., the super-channel. Hence, the fabric and the control knobs 36 are parts of the same wavelength selective switch 32. It is still possible in other types of optical switch 22 modules with some other kind of fabric where the fabric is just used to make associations across the input interfaces 16 and the output interfaces 18 but the super-channel power controls is done through some other device, for example—a VOA. The current disclosure does not limit the disclosure to any particular kind of optical switch 22 and is therefore intended to cover all such possible optical switch fabric architectures. To facilitate power controls the power monitoring device 38 can be used.

For the purpose of fault isolation in the transport network 14 and triggers facilitating protection and restoration, defect signaling carried in some in-band or out-band overhead is needed. One of the most important features of any transport network 14, i.e., the OAM, is facilitated through in-band or out-band overhead. In case of the transport network 14, the various fault triggers are OCI, and CSF, carried in the in-band frame bytes.

As per the definition in OTN specification, OCI is sourced when the connection is absent in the fabric, AIS in case of upstream failures to indicate to the downstream that some fault has occurred. In case of digital world since the fabric connection setup is done immediately post the service provisioning which ensures flow of the ODU trail data across the fabric, OCI signaling is cleared once the connection is setup in the fabric. Post this connection setup in the ODU fabric, any upstream failure condition doesn't necessitate any kind of deletion of the connection in the ODU fabric and AIS is sourced immediately. Once the upstream failure is rectified, the AIS is cleared immediately. So as can be noted here, in the digital world, once the connection in the ODU fabric is setup post the service provisioning in the north bound layer, the connection is never torn down till the service is un-provisioned.

In case of the node 10 having the optical switch 22 (such as DWDM equipment with an optical fabric), the various fault triggers are OCI, FDI (similar to AIS), and CSF carried in the OSC.

Optical networks which involve the optical switch 22 have an all-together different behavior with respect to the connection life-time in the optical switch 22. Once the service provisioning is done in a north bound layer, for example, which associates super-channel trails across the fabric of the optical switch 22, the connection setup in the fabric is not immediately done. Once the super-channel is provisioned, some nodes 10 start an auto-discovery mechanism to sense if the wavelength tuned from the light origination point is correct and only when the auto-discovery completes, the connection in the fabric is setup. In case of downstream nodes (referred to herein as express nodes and drop nodes), it is ensured through flow of optical control loop messaging that the local fabric ramp is completed only when the upstream nodes in the link (or path) have completed the ramp-up process. This is a serialized and phased ramp approach in the complete link where an upstream node executes a ramp-up process prior to a downstream node 10. Furthermore, here the connection setup in the optical switches 22 does not ensure the flow of light with right power levels across the fabric as after the connection is setup in the fabric, the power control via the control device 34 is to be accomplished to launch the super-channel on the outgoing link via the output interface 18 with an optimal power level. As discussed above, this is achieved through attenuation controls in the wavelength selective switch 32 or the VOA depending on the type of optical fabric used in the optical switch 22 where the super-channel is gradually brought up to meet a target power level which is optimum for the optical fiber to which the super-channel is launched. This can involve a closed loop control where post the attenuation settings implemented by the power control points 36, the power levels are measured for the super-channel via the power monitoring device 38 or some other spectrum power measuring device as shown in FIG. 2. Hence, the control cycle can be an attenuation setting, followed by device measurement again followed by attenuation setting and so on till the desired target power is achieved for the super-channel. More sophisticated schemes involve spectral shaping through power controls at a finer wavelength or slice level so that the complete optical profile of the super-channel is balanced and flat for error free coherent detection in the downstream light sink. This whole process is referred to herein the ramp process. These mechanisms of gradual power control and spectral shaping is required to avoid abrupt behavior in the downstream nodes 10 typically to avoid amplifier saturation, ensure coherent detection at the light sink, etc. Hence, as can be inferred from the above discussions, the super-channel trails cannot be deemed to be up across the optical switch 22 until the ramp process is complete. Hence, in some examples, OCI requires a different handling and cannot be cleared solely based on the service provisioning as OCI should additionally account for the completion of the ramp process. Similarly, on the downstream express nodes 10B and drop nodes 10, the local optical switch 22 ramp processes is started only when all the respective upstream optical nodes 10 have completed the ramp process. With respect to a particular path, this involves a serialized/phased ramp process approach.

Another aspect of optical networks, e.g., the transport network 14, is that when there is a failure upstream of the node 10, to avoid leakage of noise and causing abnormal behavior downstream of the node 10, the entire connection through the optical fabric in the optical switch 22 is torn-down. Tear down can be accomplished by programming the optical switch 22 to block the light flowing from the input interface 16 to the output interface 18. On the complete link level, connections in all of the involved optical switches 22 from the point of failure to the drop node 100 are torn down. This becomes more important from the operational point of view because when the upstream failure rectification has once happened and the super-channel power has changed due to changes in span loss, etc., not disabling the connections across the optical switches 22 might lead to leakage of a large abrupt and possibly dangerous power to the downstream nodes 10, which may have a detrimental effect on other paths being transported by the downstream nodes 10. Once the failure has been rectified in the optical domain, connections in the optical fabrics of the optical switches 22 are brought up again with the ramp process. Here, the pass-band(s) are created in the fabric of the optical switch 22 and ramp process is initiated to control the power levels and meet the target optimal power level. This again is done in a serialized/phased fashion end to end. So, the upstream failure rectification doesn't mean that the downstream defect indication—FDI in optical networks, is to be cleared immediately unlike which happens in the digital world. Since, the super-channel can't be deemed to be up once the failure rectification happens and can only be deemed up once the ramp process has completed, in accordance with the present disclosure, FDI clear cannot be signaled until the ramp process is complete.

Apart from all these, if the upstream failure conditions are not sufficient to trigger deletion of connection in the optical fabric, but still sufficient to cause the traffic to be down for the super-channel, the FDI should be sourced to the downstream nodes 10 as the super-channel is down. This usually can happen when multiple super-channels are multiplexed and fed to the output interface 18 (e.g., a tributary port) where tributary port LOS condition can be absent when less than all of the super-channels are down, to trigger the connection deletion in the fabric of the optical switches 22. This mechanism to source FDI in such cases is achieved by measuring the power levels of the super-channel in an OPM of the power monitoring devices 38 or some other type of measuring device which can monitor the power of a part of the spectrum. If the OPM measurement concludes that the power of the super-channel is very low, then FDI can be sourced irrespective of the deletion of the super-channel in the optical fabric. Hence, FDI signaling can still happen while the connection in the optical fabric is intact unlike the case discussed in the preceding sections. Similarly, post the ramp process completion, post the service provisioning, upstream failure rectifications and lock release, in accordance with the present disclosure, the power level of the super-channel should be checked to verify that the power level is sufficient to convey optical data even though the connection in the fabric is present and the super-channel has been ramped-up. If the power level is insufficient, a FDI signal should be passed to the downstream nodes 10.

Figure 3:
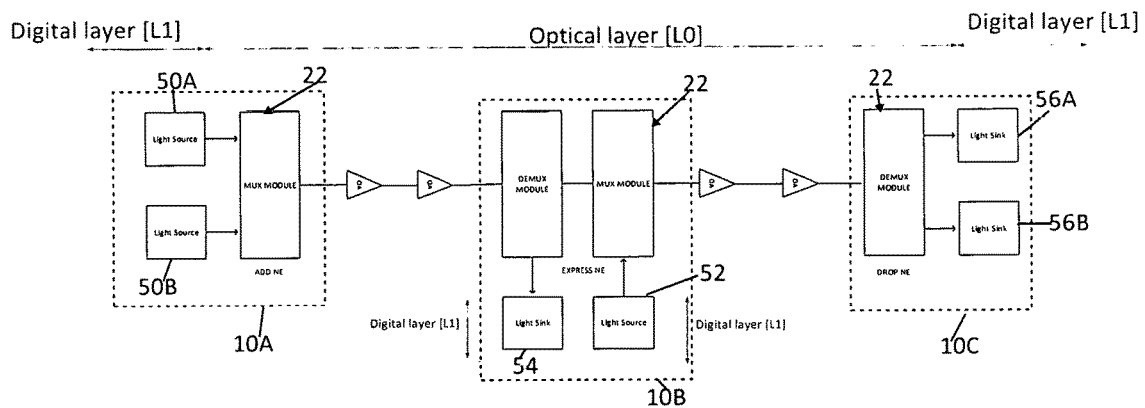
FIG. 3 is a schematic view of an exemplary optical transport network having an add node, an express node, and a drop node in accordance with examples of the present disclosure.

Referring to FIG. 3, shown therein is an example of the transport network 14. In this example, the transport network 14 includes three nodes 10 that are labeled in FIG. 3 with notations 10A, 10B, and 10C for purposes of clarity. Node 10A is an add node having multiple light sources 50A and 50B, and the optical switch 22 configured as a multiplexer. Node 10B is an express node having the optical switch 22 implemented as a demultiplexer/multiplexer pair; a light source 52; and a light sink 54. Node 100 is a drop node having the optical switch 22 implemented as a demultiplexer; and multiple light sinks 56A and 56B. The multiplexer/demultiplexer can comprise of colorless wavelength selective switches as a muxing/demuxing device or colored passive muxes/demuxes or may simply involve a junction point to which multiple light sources/sink are connected. The nodes 10A and 10B may also include a routing card 60 (see FIG. 10) which may be directly connected to the light source(s) 50A and/or 50B, and the light sink(s) 56A and/or 56B. The routing card 60 facilitates switching and bridging of the light source(s) 50/light sink(s) 56 to different degrees which may be used for purpose of restoration. The routing card 60 may include an MCS device or simply may be a broadcast module.

Figure 4:
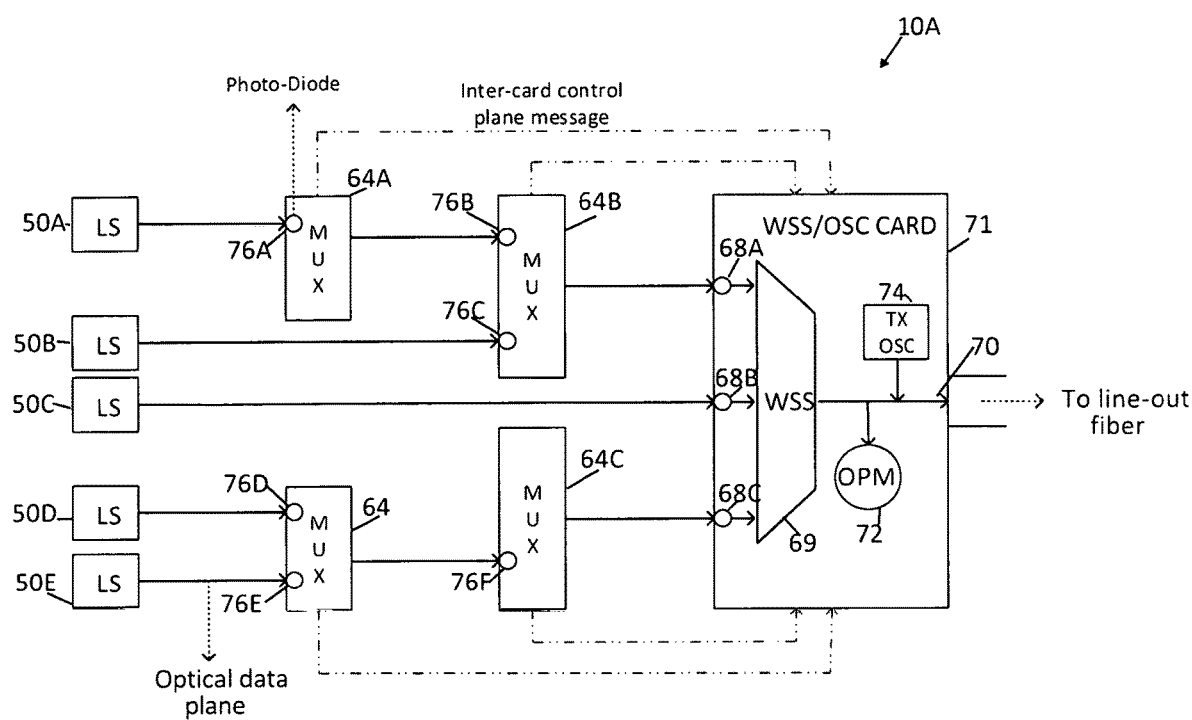
FIG. 4 is a schematic diagram of an exemplary add node having a control plane, and showing inter-card control plane messaging from various multiplexer cards where photodiode optical loss of signal declare/clear condition signals are sent to a card having a wavelength selective switch, and an optical supervisory channel module.

FIG. 4 shows an example of the add node 10A including five light sources 50A-50E providing optical signals to a series of cascaded multiplexers 64A-64D. The multiplexers 64A-64D multiplex the light provided by the light sources 50A-50E into three separate optical signals that are provided to input ports 68A-68C the wavelength selective switch 69. The wavelength selective switch 69 multiplexes the optical signals received on the input ports 68A-68C and provides multiplexed optical signals to an output port 70. A WSS/OSC card 71, in this example, include an optical power monitor 72 monitoring the power level of the multiplexed optical signals, and an optical supervisory channel transmitter 74 configured to supply operations, administration, and maintenance signals into the optical supervisory channel of the multiplexed optical signals supplied to the output port 70. The output port 70 can be connected to one or more of the output interfaces 18 of the node 10A. As shown in FIG. 4, the multiplexers 64A-64D include optical sensors 76A-76F, e.g., a photodiode, to determine the presence of lack of presence of the optical signals. Signals generated by the optical sensors 76A-76F can be used to provide an optical loss of signal declare/clear condition through inter-card control plane messaging, as shown in FIG. 4. The PD OLOS declare/clear condition is sent to the WSS/OSC card 71 which has the wavelength selective switch 69 and the optical supervisory channel transmitter 74 modules. The control plane messaging may also involve optical control loop messaging which can facilitate WSS ramp process on the wavelength selective switch 69.

Figure 5:
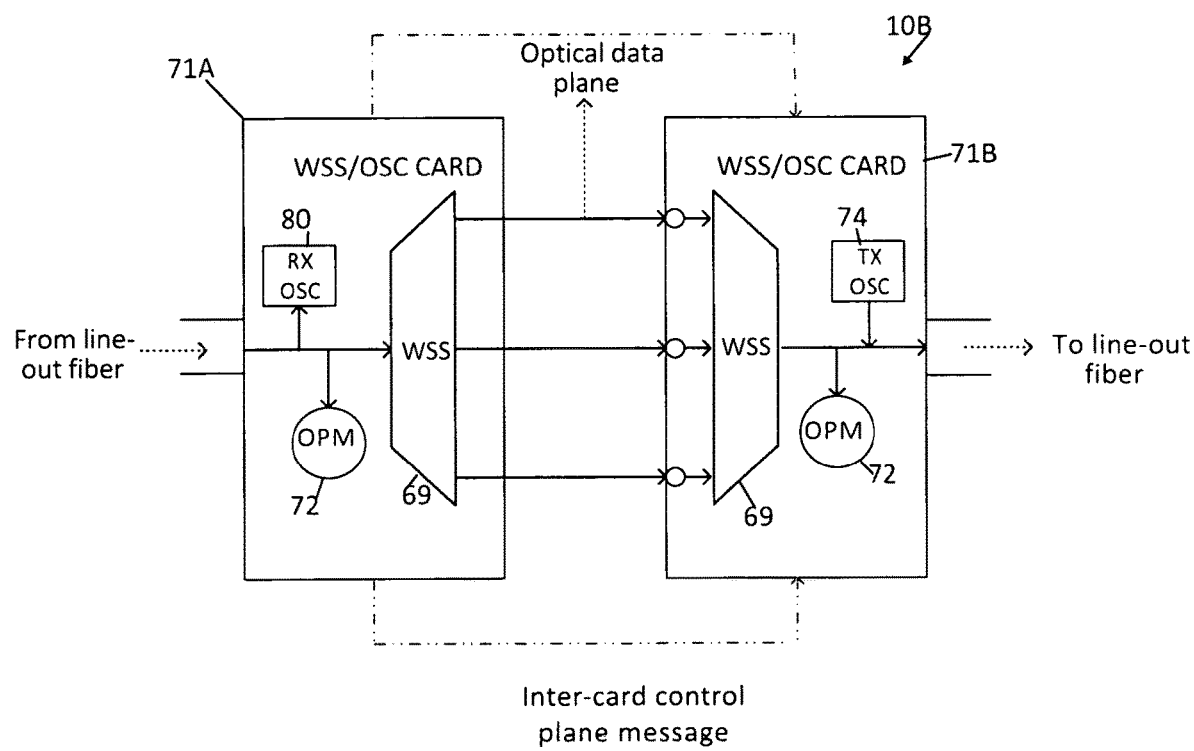
FIG. 5 is a schematic diagram of an exemplary express node showing a flow of inter-card control plane messages where upstream optical supervisory signals are tapped by an optical supervisory channel receiver monitoring the optical supervisory channel, and transmitted downstream by an optical supervisory channel transmitter providing optical signals into the optical supervisory channel.

FIG. 5 shows flow of inter-card control plane message in the express node 10B having a first WSS/OSC card 71A, and a second WSS/OSC card 71B. In this example, upstream OSC signals are tapped by an optical supervisory channel receiver 80 in the first WSS/OSC card 71A and sent to the second WSS/OSC card 71B from where the optical supervisory channel transmitter 74 further sends the OSC signals downstream. Also shown in FIG. 5 is the upstream optical control loop message sent from the upstream WSS/OSC card 71A (which again may be carried in OSC and tapped by the optical supervisory channel receiver 80) to the second WSS/OSC card 71B (it may be possible in some implementations that the optical control loop messaging is carried through other mechanism other than through OSC). In the current document an OSC signal should be interpreted as OSC (fault) signal which carries the OCI/FDI/LCK/CSF and the like and must not be as the one which necessarily carries the optical control loop messages. The reason for the same is that OSC fault signals are always carried in OSC while optical control loop messages may be carried outside the OSC.

Figure 6:
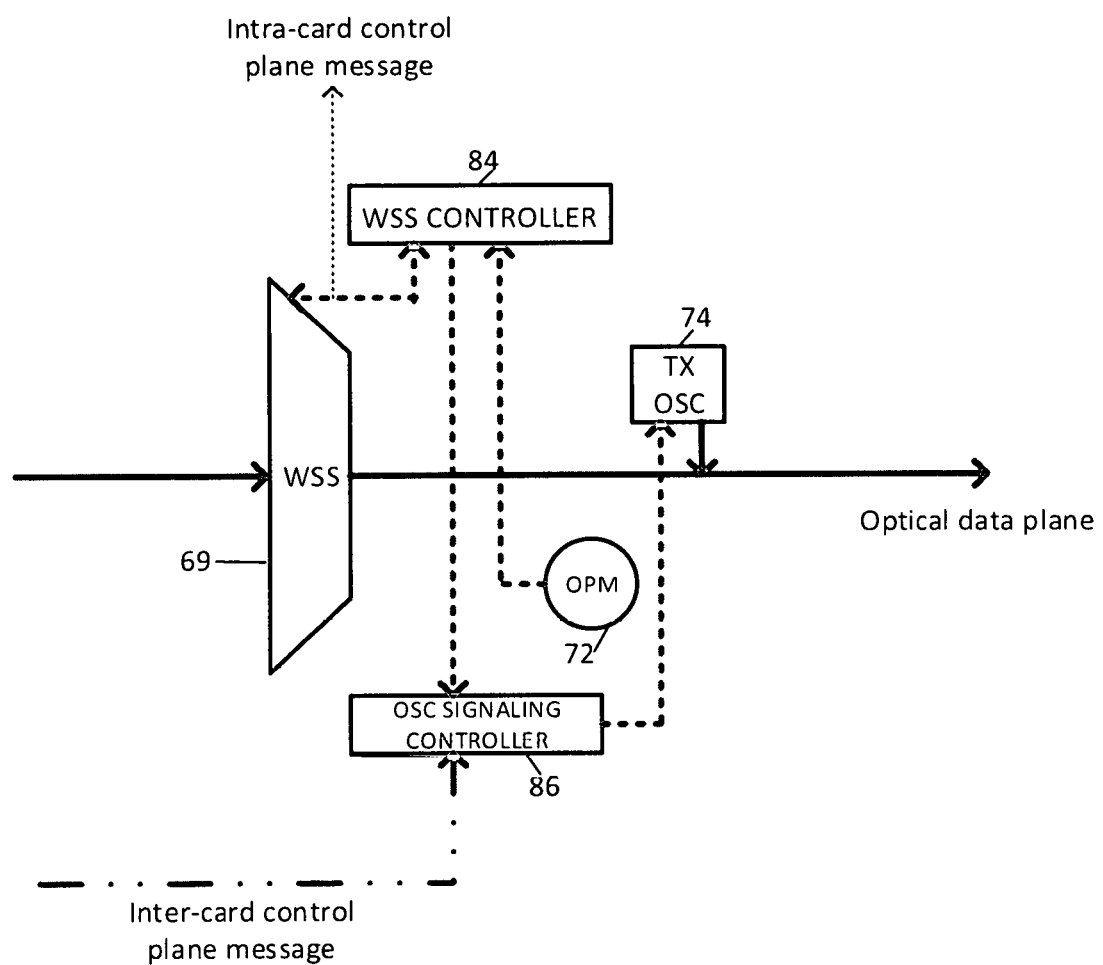
FIG. 6 is a schematic diagram of an exemplary add node/express node having an optical switch formed of a wavelength selective switch, a wavelength selective switch controller, an optical supervisory channel controller, and an optical supervisory channel transmitter in accordance with the present disclosure.

FIG. 6 shows a generalized block diagram for common circuitry in the add node 10A and the express node 10B, including the optical fabric 69, a WSS controller 84, an OSC signaling controller 86, and the optical supervisory channel transmitter 74. The WSS controller 84 and/or the OSC signaling controller 86 may be implemented with a processor with instructions stored in memory or through an ASIC or through an FPGA. The optical supervisory channel transmitter 74 takes the signaling indications from the OSC signaling controller 86 and maps the signaling indications in digital frame overhead (usually SDH STM-1 or SONET OC3 frames which is originated by a mapper device) which gets modulated to an OSC wavelength and sent along-with the muxed super-channels in the C/L Band downstream on the line out fiber in an optical format.

The WSS controller 84 reads the optical power monitor 72, and implements the ramp process for the optical fabric 69 through a control loop implementation. The WSS controller 84 creates and deletes the super-channel connections, if any, and controls the attenuation levels. Further the WSS controller 84 holds a state machine implementation which decides on the signaling indication (OCI/FDI/LCK) to be sent to the OSC signaling controller 86 based on a ramp state of the optical fabric 69. In this current diagram the optical fabric 69, WSS controller 84, OSC signaling controller 86, and the optical supervisory channel transmitter 74 are hosted on the same card. In another implementation it may be possible to have the optical fabric 69, the WSS controller 84, the OSC signaling controller 86, and the optical supervisory channel transmitter 74 hosted in different cards. In such cases, the flow of signaling indication (OCI/FDI/LCK) from the WSS controller 84 to the OSC signaling controller 86 will be done through an inter-card control plane messaging (in a similar manner as implemented for the upstream OSC signals on the express node 10B) rather than the currently shown intra-card control plane messaging. The WSS controller 84 may also send optical control loop messages to be mapped to some part of the digital frame formed by the optical supervisory channel transmitter 74 to be sent to downstream nodes 10 for control loop purpose (not shown in the current diagram as the same can also be sent through some other interface to the downstream node(s) 10).

Figure 7:
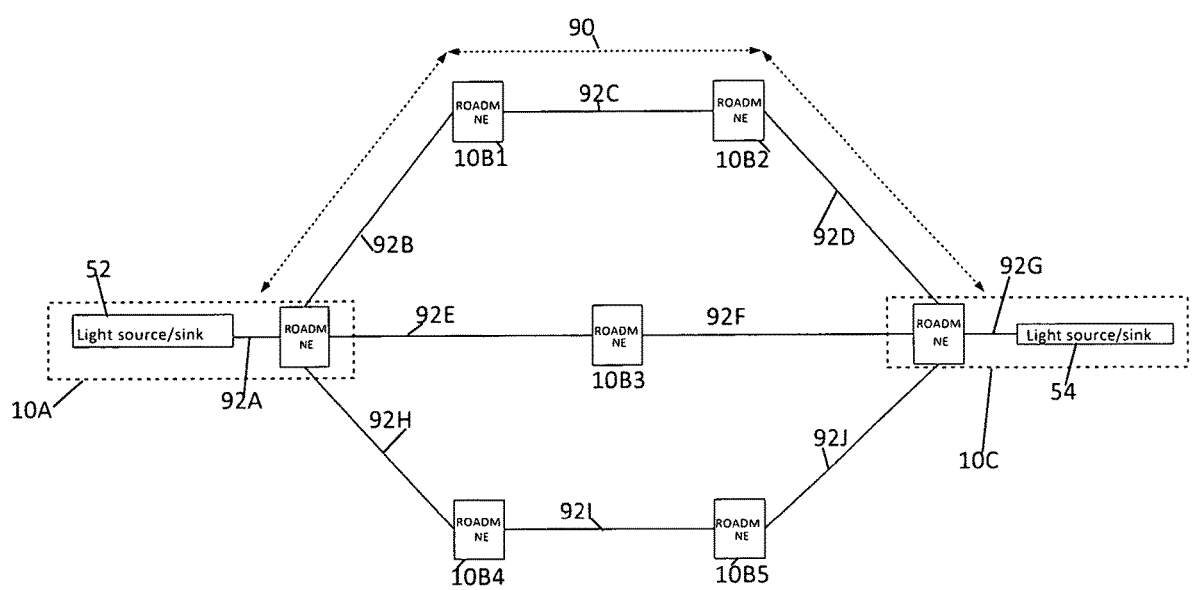
FIG. 7 is a flow diagram of an exemplary optical transport network where having an add node, multiple express nodes, and a drop node where data traffic is provided via a path from the add node, through the express nodes to the drop node in accordance with the present disclosure.

Shown in FIG. 7 is another example of the transport network 14, having nodes 10 labeled for purposes of clarity as 10A, 10B1, 10B2, 10B3, 10B4, 10B5, and 10C. In this example, the node 10A is the add node; the nodes 10B1, 10B2, 10B3, 10B4, 10B5 are express nodes, and node 10C is a drop node. Also shown in FIG. 7 is a lightpath 90 providing a service from the add node 10A to the drop node 10C. As discussed herein, a lightpath is a connection between two nodes 10 in the transport network 14, and is set up by assigning a dedicated wavelength on each link in the lightpath. In this case, the lightpath 90 provides an optical service from the light source 52 of the node 10A to the light sink 54 of the node 100, and vice-versa. The optical layer multiplexes multiple lightpaths into a single fiber and allows individual lightpaths to be extracted efficiently from the composite multiplex signal at node 10C, for example. This lightpath can be set up or taken down in response to a request. The transport network 14 may include any number of optical nodes 10. Further, the transport network 14 may be configured in any topology, for example, linear, ring, or mesh.

For purposes of simplicity of explanation, communication links 92A-92J are illustrated in FIG. 7, but it will be understood that there may be more or fewer communication links 92.

The optical nodes 10 are adapted to facilitate the communication of data traffic (which may be referred to herein as "traffic" and/or "data") in the transport network 14 over communication links 92A-92J, as well as into and out of the transport network 14.

The communication links 92 can be implemented in a variety of ways, such as an optical fiber or other waveguide carrying capabilities. The communication links 92 can be fiber optic cables. Some of the communication links 92 can be implemented as patch cables, such as the communication links 92A and 92G.

Figure 8:
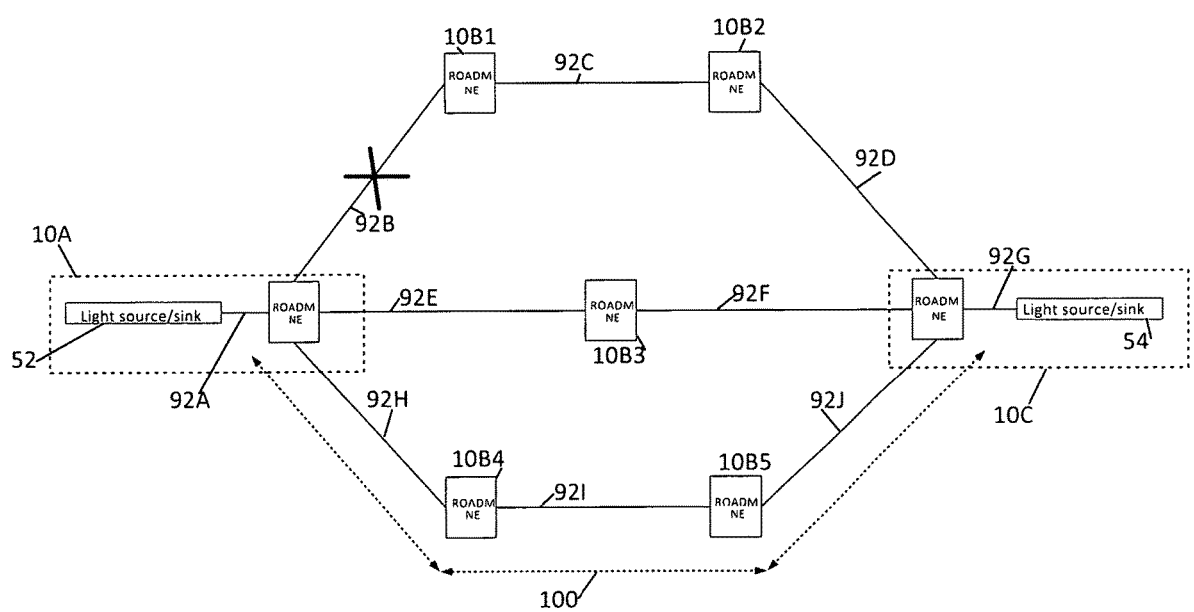
FIG. 8 is a flow diagram of the exemplary optical transport network of FIG. 7 where a fault has occurred between the add node and an express node, and where a restoration/protection path has been created between the add node and the drop node.

FIG. 8 shows a failure occurring in the transport network 14 in the communication link 92B, and an alternate restore/protect path 100 being set up for the optical service when a failure happened on the previous lightpath 90. As shown in FIG. 8, the lightpath 90 has been disabled.

Figure 9:
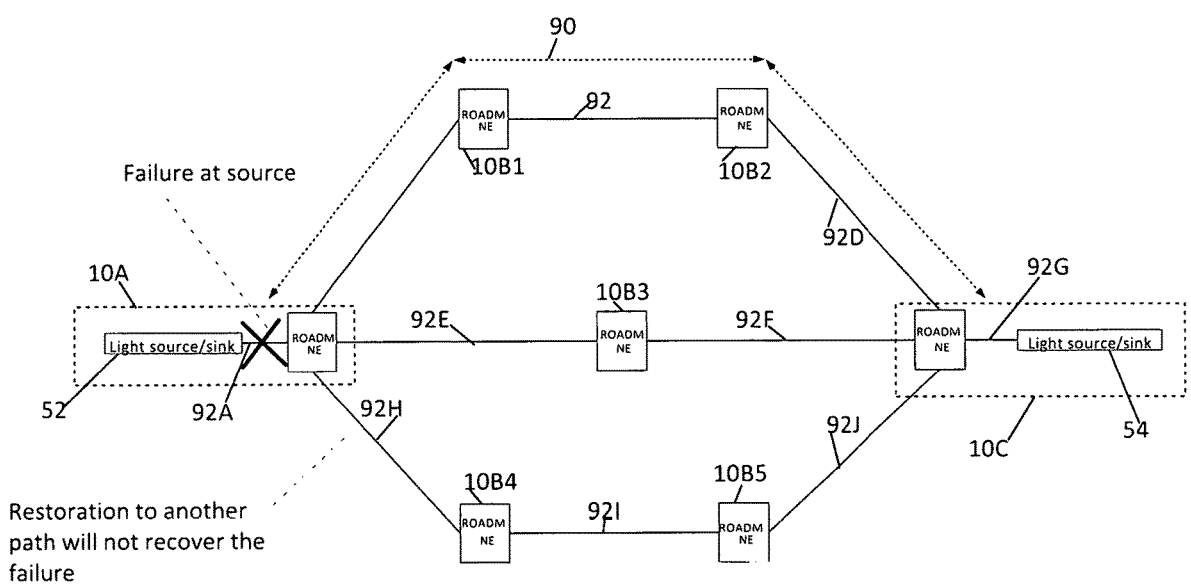
FIG. 9 is a flow diagram of the exemplary optical transport network of FIG. 7 where a fault (known as a failure at the source) has occurred within the add node in a location in which restoration or protection is in-effective since there is no alternate path available for the data traffic.

FIG. 9 shows a failure scenario in the transport network 14 in the communication link 92A where restoration or protection is in-effective since there is no alternate path available for the traffic flow. Such kinds of failure are referred to as failure at the source.

Figure 10:
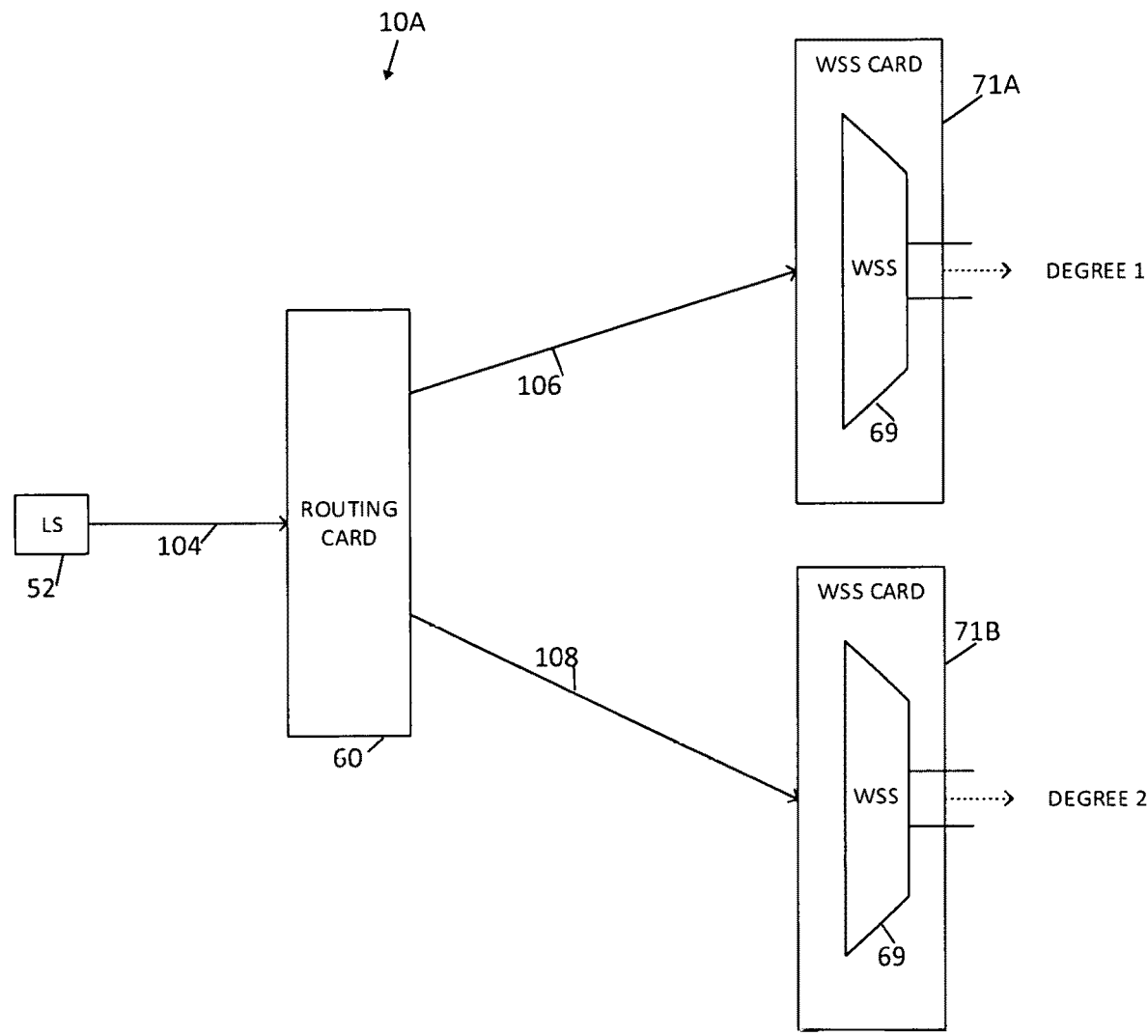
FIG. 10 is a schematic diagram of the exemplary add node depicting a chain of patch cable connections within the add node, and different output ports that are known in the art as "degrees".

FIG. 10 is a block diagram of part of the add node 10A in which the light source 52 is connected to the routing card 60 with a first patch cable 104. The routing card 60 is connected to a first WSS/OSC card 71A via a second patch cable 106, and is also connected to a second WSS/OSC card 71B via a third patch cable 108. The line out towards network for the first WSS/OSC card 71A is referred to in FIG. 10 as DEGREE 1; and the line out towards network for the second WSS/OSC card 71B is referred to in FIG. 10 as DEGREE 2.

Figure 11:
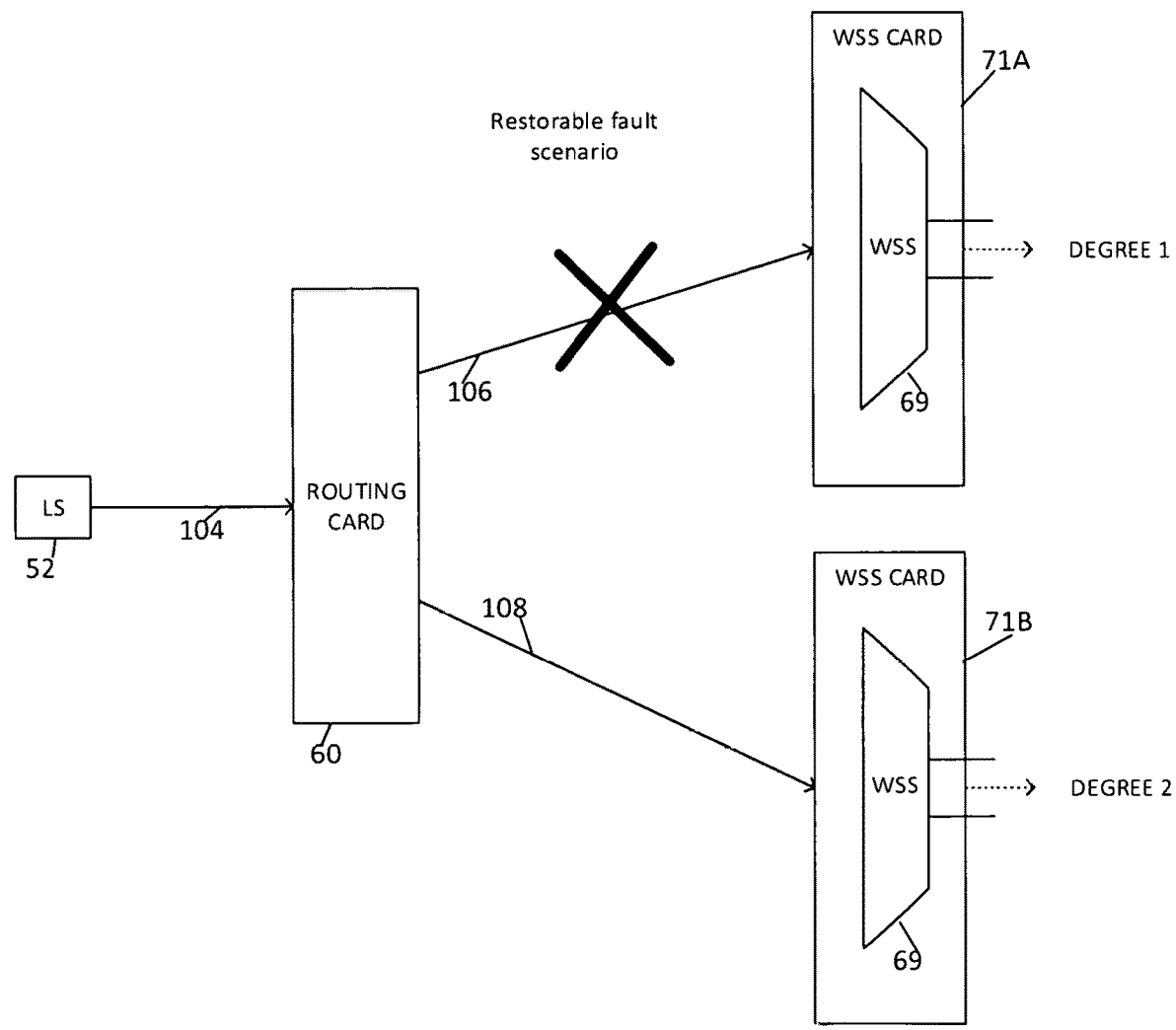
FIG. 11 is another schematic diagram of the add node of FIG. 10 in which a restorable fault has occurred in a patch cable connecting a routing card to one of a group of wavelength selective switches in the add node.

FIG. 11 is another block diagram of the part of the add node 10A depicted in FIG. 10 showing an exemplary patch cable failure in the patch cable 106 which manifests in downstream FDI signaling.

Figure 12:
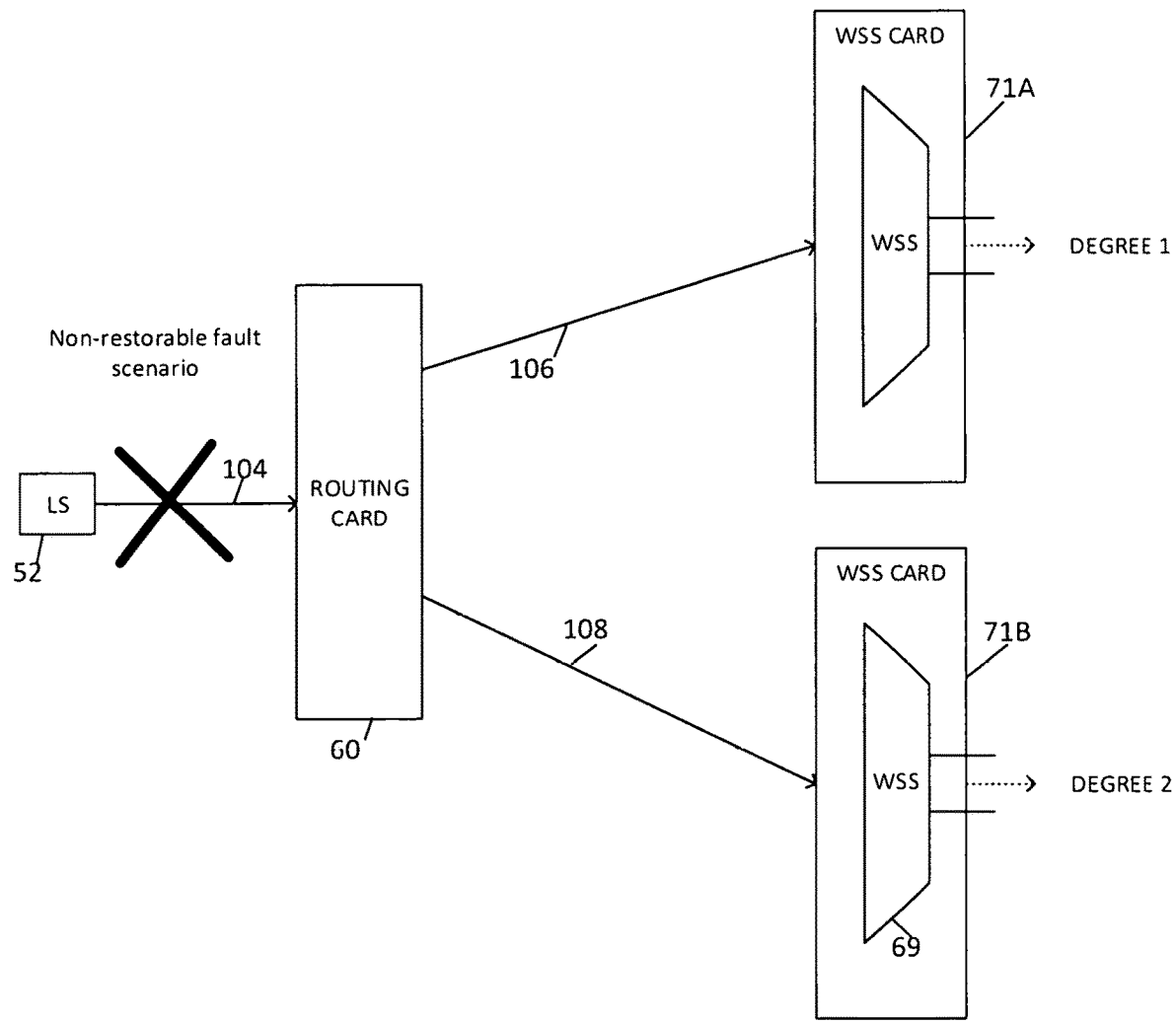
FIG. 12 is another schematic diagram of the add node of FIG. 10 in which a non-restorable fault (known as a failure at the source) has occurred between a light source and a routing card within the add node.

FIG. 12 is another block diagram of the part of the add node 10A depicted in FIG. 10 showing another exemplary patch cable failure scenario in the patch cable 104 which manifests as downstream CSF signaling. This condition is referred to as failure at the source.

Discussed hereinafter are two specific examples of methodologies of the present disclosure that eliminate the occurrence of false restoration occurring in the transport network 14. It should be understood that the present disclosure is not limited to these specific examples.

Example 1

In the first example, it should be noted that after the service provisioning is done by the operator, the first ramp in the optical fabric 69 of the optical switch card 22 will not be complete if a failure is present at the source. In such cases, due to the failure to complete the first ramp, the WSS controller 84 would signal OCI in the transport network 14. The OCI being signaled in the transport network 14 may act as a restoration or protection trigger after a certain time-out window since the restoration or protection engine may perceive the same to be due to deletion of the service provisioning or failure of ramp process due to some other fault condition in the transport network 14.

To handle such cases and to avoid triggering restoration due to a failure at the source itself and which is a non-restorable condition, it is proposed in this disclosure to detect the failure at the source with the optical sensor 76, generate an OLOS declare, and provide the OLOS declare to the OSC signaling controller 86. The OLOS from the optical sensor 76 on the MUX card 64 is sent to the OSC controller 86. In addition, the OCI is sent by the WSS controller 84 to the OSC controller 86. The OSC controller 86 has network topology information, including a location of the patch cable and mux card connection topology information, available in a network topology database to deduce whether or not the OLOS declare from the optical sensor 76 is a failure at source. If the OLOS declare is a failure at the source, then the OSC controller 86 will generate and provide a CSF signal to the optical supervisory channel transmitter 74 along with the OCI. The optical supervisory channel transmitter 74 will then signal the CSF along with OCI in the transport network 14. The combined CSF and the OCI, for example, prevents false restorations and protection on such an OCI time-out. The current disclosure proposes to source CSF along with an OCI in the transport network 14 where after the service provisioning is done by the operator, the first ramp process itself is in-complete due to a failure at the source. This is philosophically quite different to what is done in the digital networks and current optical networks. There is no case in the present state of the art networks where a CSF is signaled along with an OCI post the service provisioning.

Figure 13:
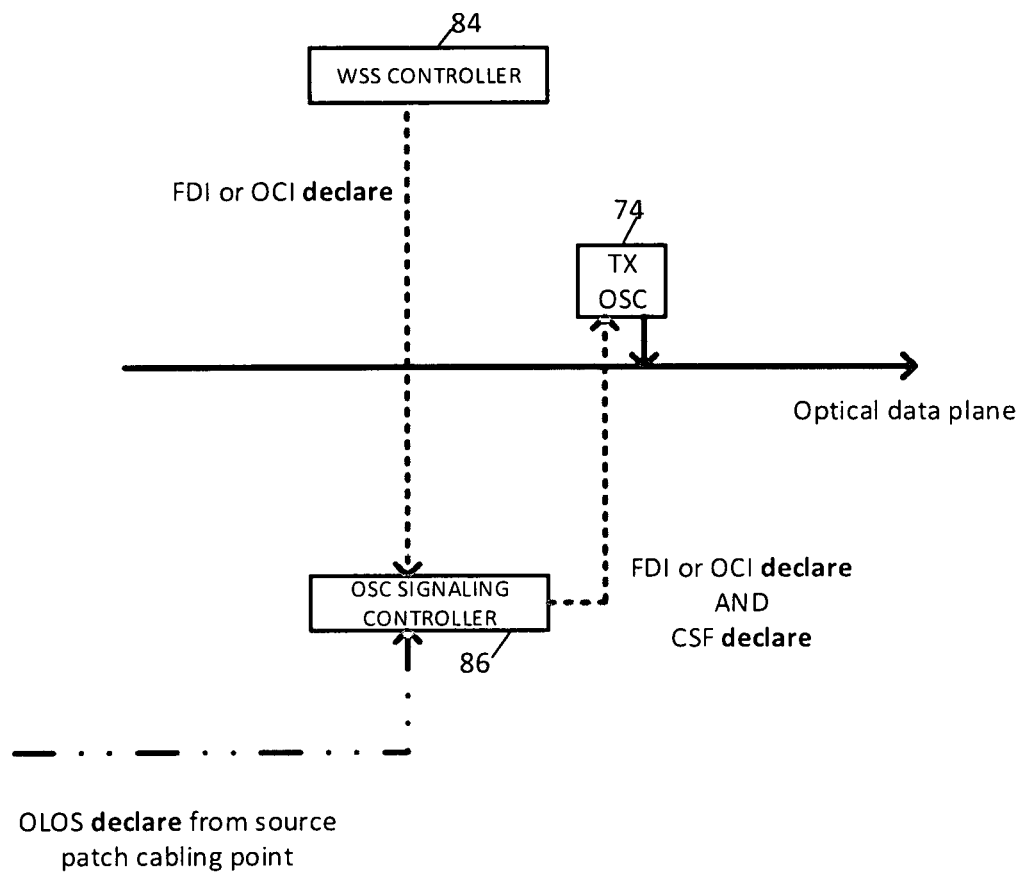
FIG. 13 is another schematic diagram of the add node of FIG. 10 in which a non-restorable fault has occurred resulting in an optical loss of signal declaration detected by a photo diode, for example.

As shown in FIG. 13, on the add node 10, when an OLOS declare event due to failure at source is present along with the OCI indication from the WSS controller 84 (after the service provisioning) at the OSC signaling controller 86, both the CSF and OCI indication are sent to the optical supervisory channel transmitter 74 which manifest in sending the OCI declare and CSF declare together in the downstream OSC in the link.

Figure 14:
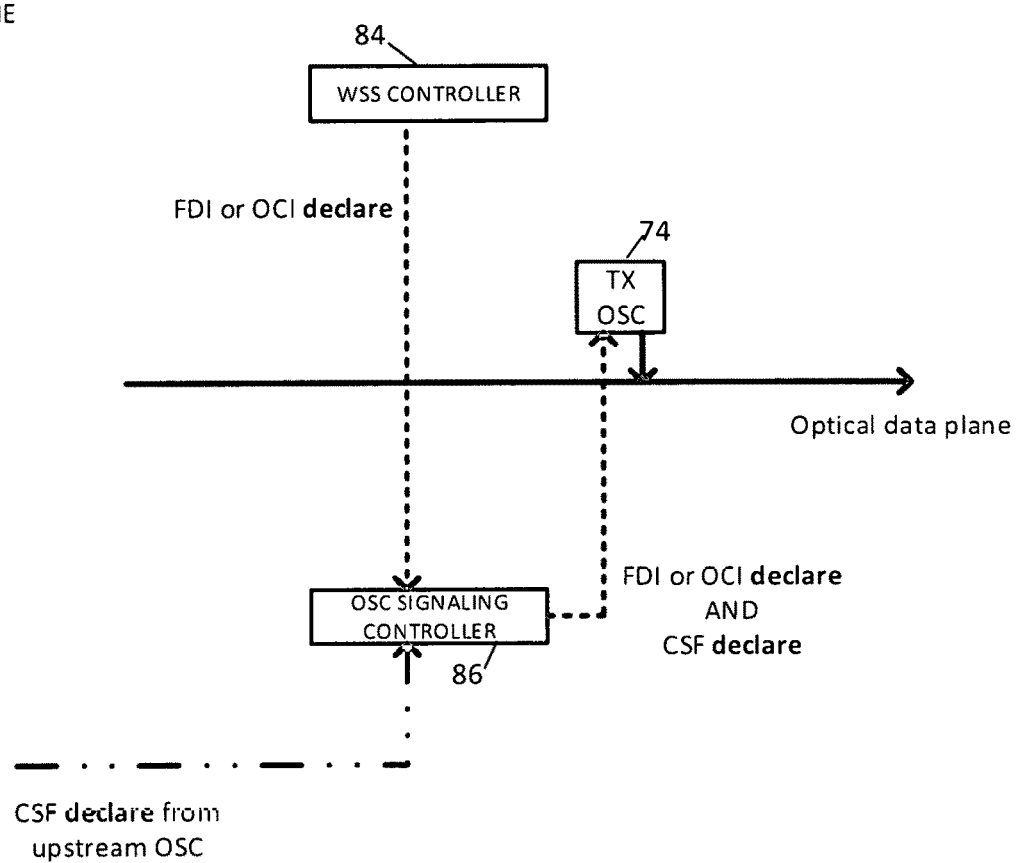
FIG. 14 is a schematic diagram of an express node in which a client signal failure indication is received by an optical supervisory channel signaling controller of the express node.

As shown in FIG. 14, on the express node 10B, when an upstream CSF indication is coming from the upstream OSC along-with an OCI (or FDI) indication from the WSS controller 84 (after the service provisioning) to the OSC signaling controller 86, the OSC signaling controller 86 sends both the 001 and CSF together to the optical supervisory channel transmitter 74 which manifest in sending OCI declare and CSF declare together in the downstream OSC in the link.

Hence, the solution as proposed above solves the problem for Example 1 to prevent a false restoration on OCI time-out.

Similarly, for a teardown of the WSS connection post the first ramp due to failure at the source, both the FDI and CSF may be chosen to be sent downstream to avoid seeing only FDI alone on the restoration or protection engine which again may trigger false restoration.

Example 2

To safeguard against leakage of noise and high power after a failure recovery, when a failure happens in the transport network 14, the WSS controller 84 through a received optical control loop messaging (via OSC or some-other mechanism of flow of messaging information) identifies that there is a failure in the upstream and based on the same tears down a local optical switch 22 (e.g., WSS) connection for the super-channel. Further downstream through optical control loop messaging, all the express nodes 10B also tear down their local optical switch 22 (e.g., WSS) connection for the super-channel. To continue indicating to the downstream network for restoration and protection that connection in the optical switch 22 is absent, the WSS controller 84 indicates to the OSC signaling controller 86 either an OCI (when first ramp itself is in-complete for super-channel post the service provisioning done by the user) or FDI-P (tear down of the WSS connection on upstream failure conditions—optical control loop behavior). The OSC signaling controller 86 may further provide a CSF indication (OLOS coming from patch cabling points or upstream OSC in case of express node 10B) to the optical supervisory channel transmitter 74 module which further maps the CSF indication to an OSC digital frame modulated on the OSC wavelength. This acts as a trigger to the restoration engine or protection engine in the downstream that some failure has happened in the upstream. The restoration engines of the downstream nodes 10 may consider switching to an alternate path in the absence of the CSF indication, i.e., based on restorable fault indication (FDI or OCI alone). In the presence of the CSF indication, the restoration engines of the downstream nodes will not consider switching to an alternate path based on a non-restorable fault indication (CSF either alone or co-existing with OCI/FDI). Such an implementation prevents false restorations in systems where optical switch 22 connections are dynamically created or deleted based on upstream failure condition. This is similar to Example 1 in which co-existing OCI and CSF are provided after service provisioning.

The problem for Example 2 occurs after the failure has been resolved and during recovery procedures. In cases of recovery of failure at the source (the failure which originally manifested in OLOS declare indication to the OSC signaling controller), the OLOS indication would be cleared by the sourcing routing card 60 at the add node 10A. But still the FDI or OCI indication may continue to be indicated from the WSS controller 84 by all the nodes 10 in the link, since the WSS ramp process takes time. In cases of express nodes 10B further downstream, there would a serialized ramp process initiated at each optical switch 22 (on a hop by hop basis) followed by sending optical control loop message indications further downstream to indicate that failure has cleared and hence the optical ramp process at a next downstream node 10 can start. In such cases, a solely existing FDI or OCI indication to the OSC signaling controller 86 will result in false restoration. This is due to downstream signaling of the FDI or OCI indication where the CSF indication is absent. When the restoration engine on downstream nodes 10 receives a CSF clear condition in combination with FDI or OCI present, the restoration engine will trigger a restoration which defeats the whole purpose of sending the CSF indication in the first place. Because connection in the optical switch 22 was disabled due to a CSF condition that resulted in an FDI indication, or the optical signals were not ramped up in the first place due to the CSF condition that resulted in the OCI indication, it is undesirable for the lack of a CSF condition at the source to result in restoration triggers when the failure has been rectified.

The solution proposed in this disclosure is to bring the path online using a serial hop by hop process starting with the add node 10A and continuing downstream to the drop node 10C. At each node 10A, 10B or 100 in the path, the OSC signaling controller 86 will delay the downstream transmission of a CSF clear signal until the ramp process at the local node 10 is complete. Due to the serial process for initiating the ramp process to bring a path online, this requires a mechanism in place at each of the nodes 10 in the path to prevent premature transmission of a CSF clear condition downstream until the local optical switch 22 ramp process is complete.

Some vendors in the current state of the art implementation which follow phased fabric ramp approach choose to have a soak time implemented at the restoration or protection engine where on a CSF clear condition they soak the same and avoid acting on the solely existing OCI or FDI-P till the soak timer expiry. Here, the soak timeout value has to be set as the complete link turn-up time end to end where the soak timeout value accounts for the ramp time till the last hop all the fabric ramp is complete. This time can be very large since the soak timeout value depends on the number of hops and hence may run in order of several minutes and even hours. Secondly, this soak time is dependent on the number of hops which may be difficult to take into account by the restoration or protection engine. Thirdly, in cases where there may be genuine failure cases which can result in OCI or FDI in between this soak time interval, the switching action by the restoration and protection engine would be deferred by this large soak timeout which would impact the traffic downtime and hence would be highly undesirable. The following is a proposed solution which avoids such link dependent soak times in the restoration or protection engine.

When on the add node 10A failure at the source is rectified, an OLOS clear event is provided to the OSC signaling controller 86. The OSC signaling controller 86 does not immediately provide the CSF clear indication to the optical supervisory channel transmitter 74. Rather, the OSC signaling controller 86 starts a timer having a node soak time, e.g., an expected amount of time for the optical switch 69 at the add node 10A to complete the ramp process. Then, the OSC signaling controller 86 sends the CSF clear indication to the optical supervisory channel transmitter 74 (which immediately sends the CSF clear indication to the next node 10 downstream in the path) at the first occurrence of either: (1) a FDI-P or OCI clear indication from the WSS controller 84 indicating completion of the ramp process, or (2) expiration of the timer. Due to such an implementation, the CSF indication is cleared in the OSC of the downstream node(s) 10 only when the ramp process has completed in the upstream node(s) 10 post the failure recovery at the source. This methodology continues on a hop by hop basis in a serial manner starting at the add node 10A, and ending at the drop node 100 in the path. In this way, any false restoration triggers are avoided. A link dependent soak time taking into account a summation of the ramp process times for all nodes in the path, or the number of hops, does not have to be calculated or even taken into account by the restoration and protection engines. Thus, the presently disclosed concepts improve upon the conventional manner of avoiding false restorations in optical transport networks.

When one of the express nodes 10B receives an upstream CSF clear event at the optical supervisory channel receiver 80, the optical supervisory channel receiver 80 provides the CSF clear event to the OSC signaling controller 86 via inter-card messaging, or intra-card messaging as discussed above. The OSC signaling controller 86 starts the timer having a node soak time, e.g., an expected amount of time for the optical switch 69 at the express node 10B to complete the ramp process. Then, the OSC signaling controller 86 sends the CSF clear indication to the optical supervisory channel transmitter 74 (which immediately sends the CSF clear indication to the next node 10 downstream in the path) at the first occurrence of either: (1) a FDI-P or OCI clear indication from the WSS controller 84 indicating completion of the ramp process, or (2) expiration of the timer. So, this prevents sending an immediate CSF clear signaling indication to another express node 10B (or the drop node 10C) downstream. Similar, logic is used in further express nodes 10B downstream on a hop by hop basis. The node soak time should account for an expected or typical amount of time for the local ramp process to complete on the optical switch 69 for a super-channel in one span only and not the complete end-to-end link soak time taking into account the number of hops in the path. As discussed above, the link soak time is difficult to estimate and can be a very large value.

The logic in accordance with the present disclosure, ensures that a CSF clear indication will not be received by the drop node 10C till the ramp process has been fully completed in all of the upstream nodes 10A and 10B within the path. Hence, false restoration or protection triggers due to a failure and its subsequent rectification at the source is prevented.

Figure 15:
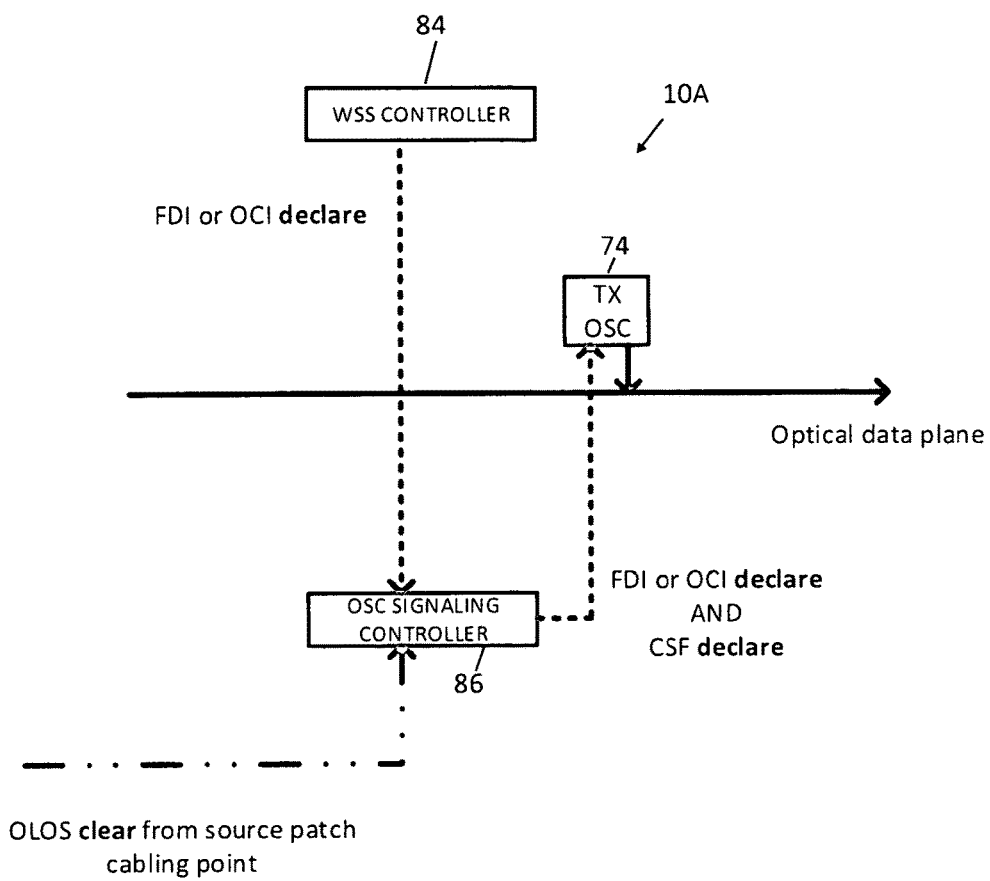
FIG. 15 is another schematic diagram of the add node of FIG. 10 in which an optical loss of signal clear signal manifests in starting a timer and does not manifest an immediate client signal failure clear indication sent downstream in the path when a pending fault indication, e.g., FDI or OCI indication is still present from a wavelength selective switch controller.

FIG. 15 shows the case in an add node 10A, where OLOS clear from the source patch cabling point does not manifest in an immediate CSF clear indication being sent downstream when a pending outstanding FDI or OCI indication is still present from the WSS controller 84. On getting an OLOS clear event from the source patch cabling point, a local timer having the node soak time is started by the OSC signaling controller 86, as discussed above.

Figure 16:
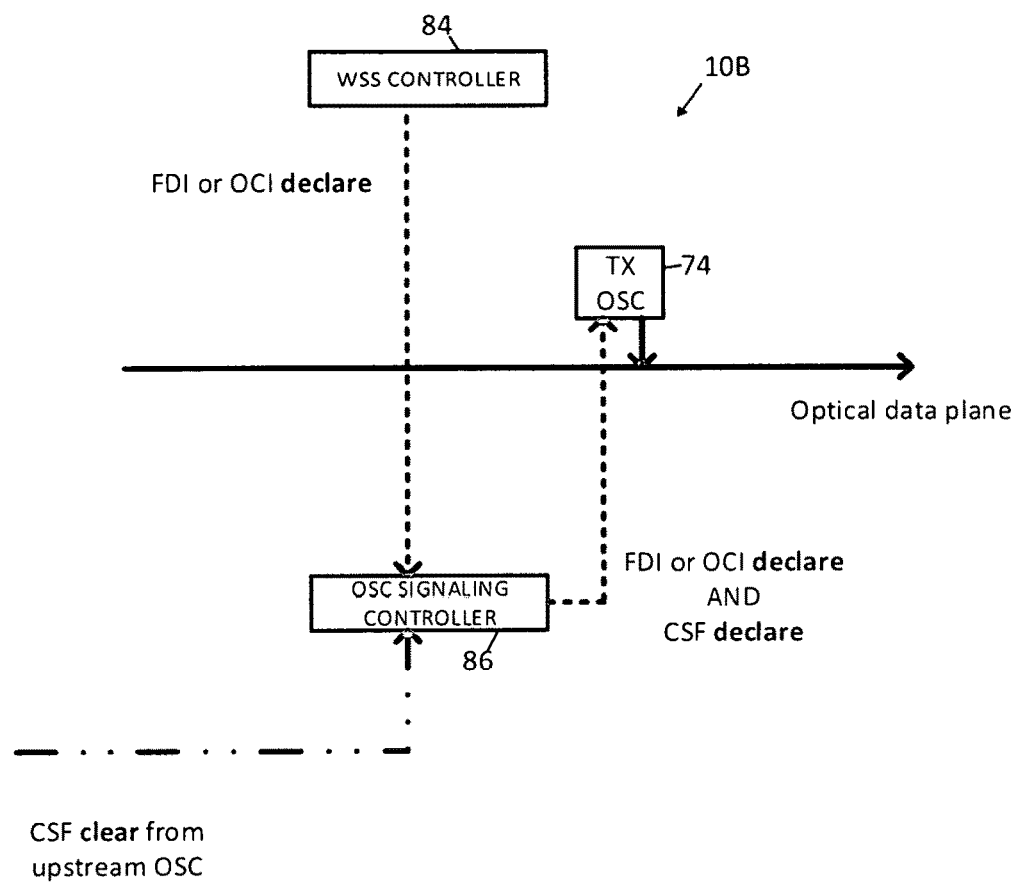
FIG. 16 is another schematic diagram of the express node in which a client signal failure clear signal from an upstream node manifests in starting a timer and does not manifest in immediate client signal failure clear indication sent downstream when a pending outstanding fault indication is still present from a local wavelength selective switch controller.

FIG. 16 shows the case in an express node 10B, where a CSF clear event from the upstream OSC does not manifest in an immediate CSF clear indication being sent downstream when a pending outstanding FDI or OCI indication is still present from the local WSS controller 84. On receiving a CSF clear event from the upstream OSC, a local timer having the node soak time is started by the OSC signaling controller 86.

Figure 17:
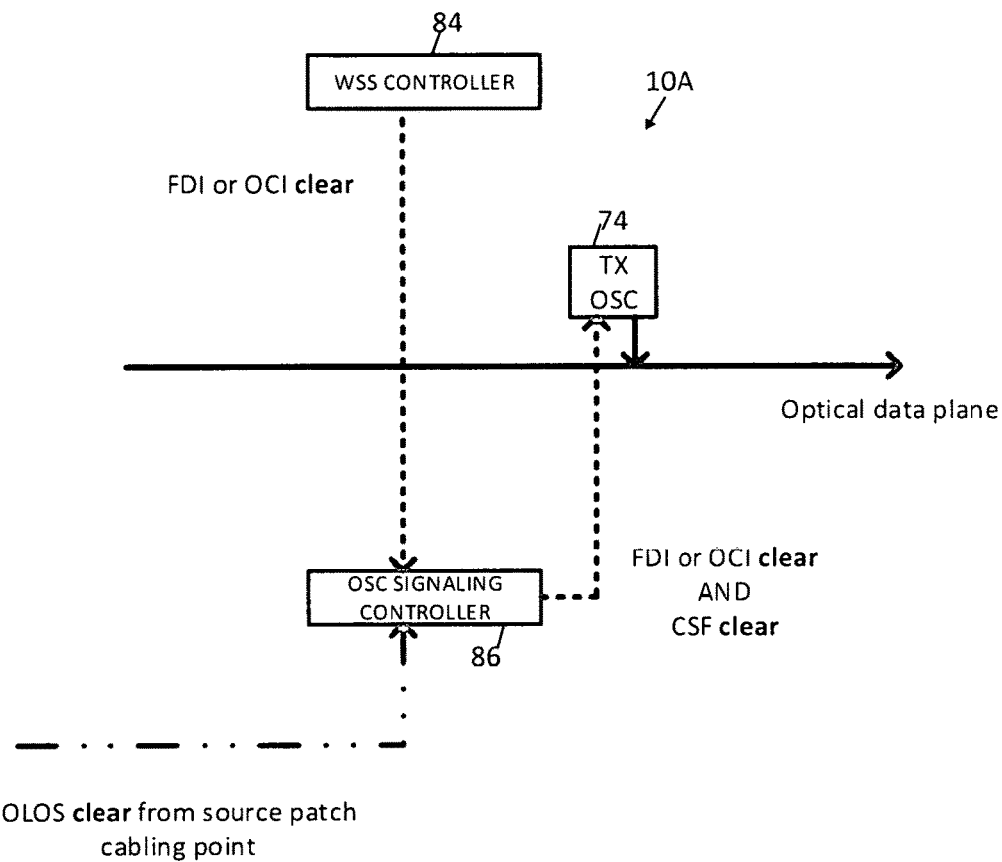
FIG. 17 is a schematic diagram of the add node of FIG. 10 in which the timer is still running, but the fault indication is cleared due to substantial completion of the ramp-up process, in which optical signals have sufficient power to carry data traffic to a downstream node, resulting in sending a client signal failure clear indication downstream, and stopping the timer.

FIG. 17, shows a case in the add node 10A where while the local timer is still running, the FDI or OCI clear indication (indicating that the local ramp process is complete) is provided to the OSC signaling controller 86 from the local WSS controller 84, resulting in sending a CSF clear indication downstream. The local timer is stopped in this case.

Figure 18:
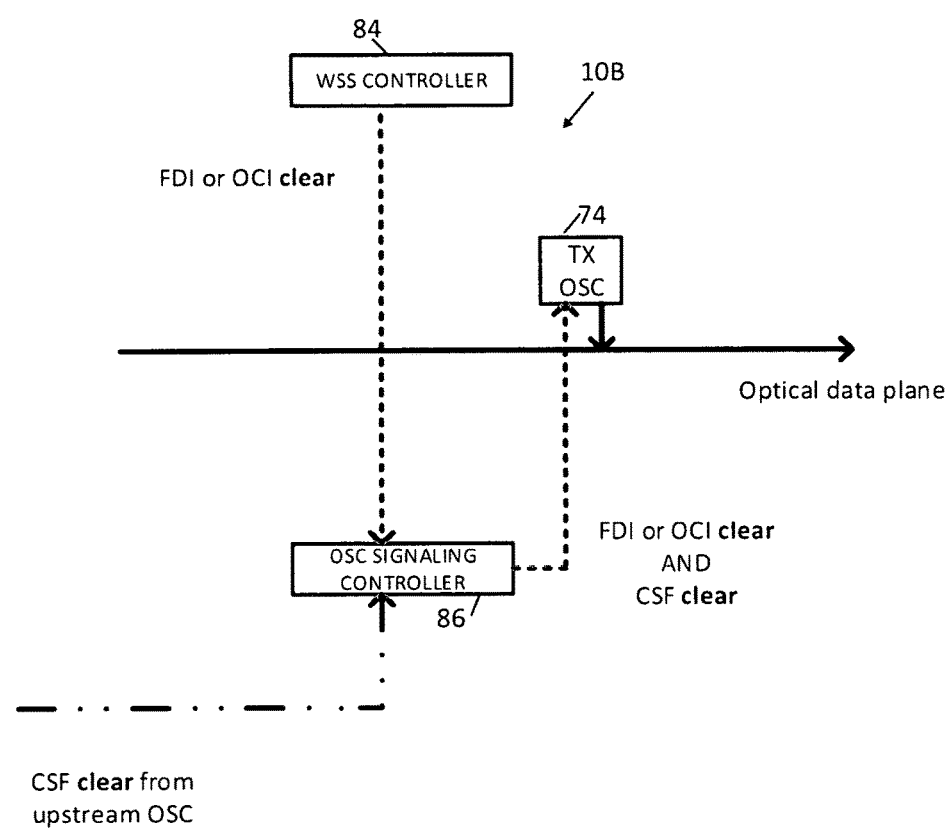
FIG. 18 is a schematic diagram of the express node in which the timer is still running, but the fault indication is cleared due to substantial completion of the ramp-up process, in which optical signals have sufficient power to carry data traffic to a downstream node, resulting in sending a client signal failure clear indication downstream, and stopping the timer.

FIG. 18, shows a case in the express node 10B where while the local timer is still running, the FDI or OCI clear indication (indicating that the local ramp process is complete) is provided to the OSC signaling controller 86 from the local WSS controller 84, resulting in sending a CSF clear indication downstream. The local timer is stopped in this case.

Figure 19:
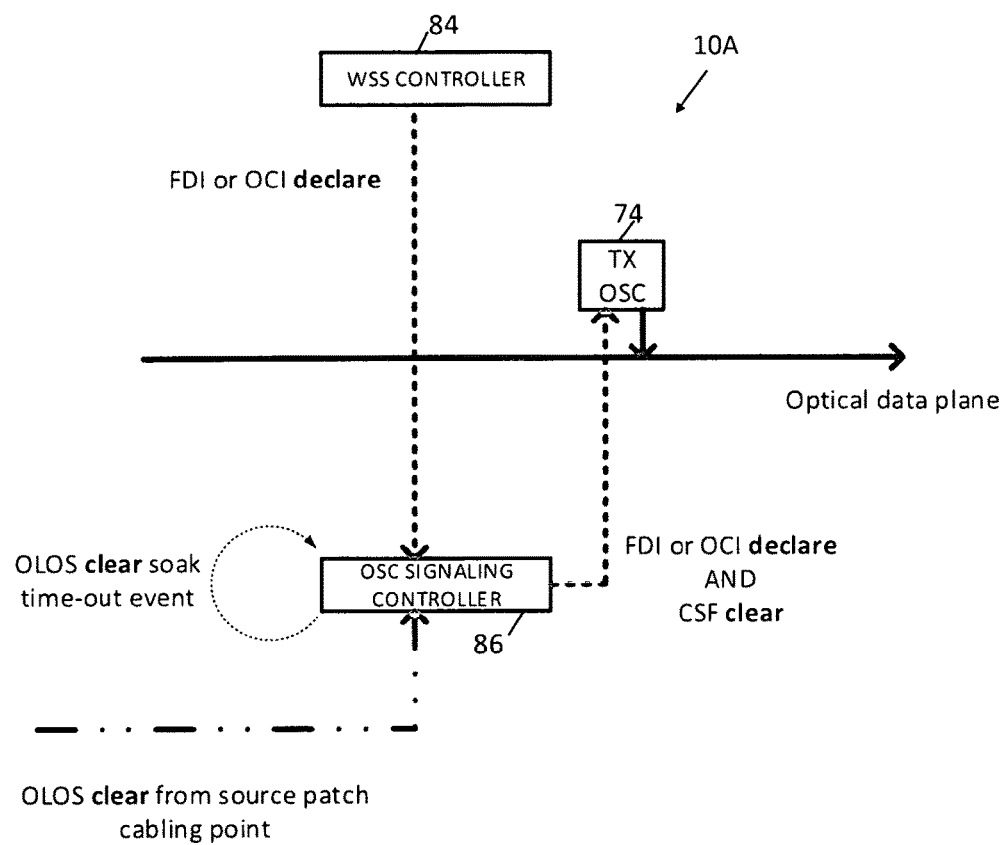
FIG. 19 is a schematic diagram of the add node of FIG. 10 in which the timer has expired prior to the fault indication being cleared resulting in sending a client signal failure clear indication downstream, and stopping the timer.

FIG. 19 shows a case in the add node 10A where the local timer expiry event manifests in sending CSF clear downstream, even though the FDI or OCI clear indication has not been provided from the local WSS controller 84 to the OSC signaling controller 86.

Figure 20:
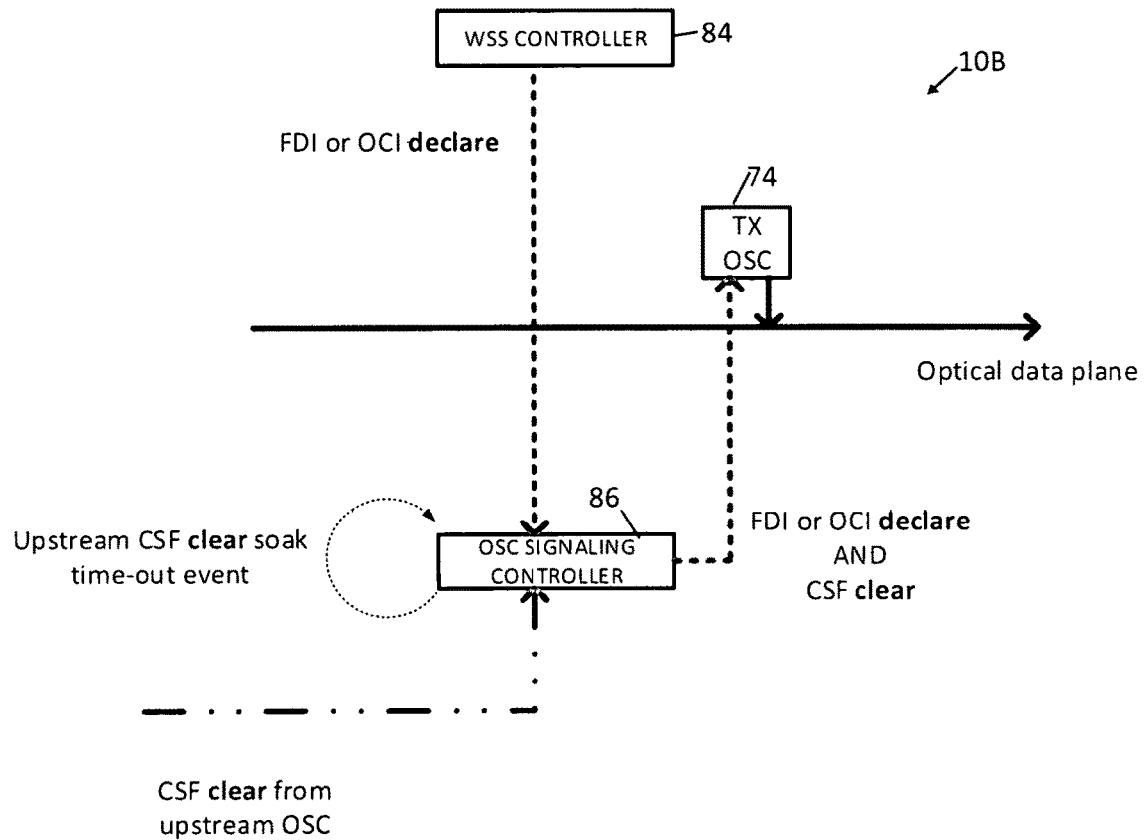
FIG. 20 is a schematic diagram of the express node in which the timer has expired prior to the fault indication being cleared resulting in sending a client signal failure clear indication downstream, and stopping the timer.

FIG. 20 shows a case in the express node 10B where the local timer expiry event manifests in sending CSF clear downstream, even though the FDI or OCI clear indication has not been provided from the local WSS controller 84 to the OSC signaling controller 86.

CONCLUSION

Some vendors in the current state of the art implementation choose to have a end to end link dependent soak time (i.e., predetermined time period) implemented at the restoration or protection engine where on a CSF clear condition the restoration or protection engine waits until the end of the link dependent soak time to avoid acting on the solely existing OCI or FDI-P. In the previous art implementations, however, the predetermined time period has to be set sufficiently large to account for a summation of the ramp process times at all nodes in the link.

The present disclosure improves upon the current state of the art implementation with specialized logic in the OSC signaling controller 86 at each node in the path. The OSC signaling controller 86 does not immediately provide the CSF clear indication to the optical supervisory channel transmitter 74. Rather, the OSC signaling controller 86 starts a timer having a node soak time, e.g., an expected amount of time for the optical switch 69 to complete the ramp process. Then, the OSC signaling controller 86 sends the CSF clear indication to the optical supervisory channel transmitter 74 (which immediately sends the CSF clear indication to the next node 10 downstream in the path) at the first occurrence of either: (1) a FDI-P or OCI clear indication from the WSS controller 84 indicating completion of the ramp process, or (2) expiration of the timer. Due to such an implementation, the CSF indication is cleared in the OSC of the downstream node(s) 10 only when the ramp process has completed in the upstream node(s) 10 and the local node post the failure recovery at the source. This methodology continues on a hop by hop basis in a serial manner starting at the add node 10A, and ending at the drop node 10C in the path. In this way, any false restoration triggers are avoided. An end to end link dependent soak time taking into account a summation of the ramp process times for all nodes in the path, or the number of hops, does not have to be calculated or even taken into account by the restoration and protection engines. Thus, the presently disclosed concepts improve upon the conventional manner of avoiding false restorations in optical transport networks.

The foregoing description provides illustration and description, but is not intended to be exhaustive or to limit the inventive concepts to the precise form disclosed. Modifications and variations are possible in light of the above teachings or may be acquired from practice of the methodologies set forth in the present disclosure.

Also, certain portions of the implementations may have been described as "components" or "circuitry" that performs one or more functions. The term "component" or "circuitry" may include hardware, such as a processor, an application specific integrated circuit (ASIC), or a field programmable gate array (FPGA), or a combination of hardware and software.

Even though particular combinations of features are recited in the claims and/or disclosed in the specification, these combinations are not intended to limit the disclosure. In fact, many of these features may be combined in ways not specifically recited in the claims and/or disclosed in the specification. Although each dependent claim listed below may directly depend on only one other claim, the disclosure includes each dependent claim in combination with every other claim in the claim set.

No element, act, or instruction used in the present application should be construed as critical or essential to the invention unless explicitly described as such outside of the preferred embodiment. Further, the phrase "based on" is intended to mean "based, at least in part, on" unless explicitly stated otherwise.

What is claimed is:

1. A method comprising the steps of:
    receiving, by circuitry of a first controller of a first node on a first path within a transport network, a first signal indicating a failure within the first path, and a client signal failure indicating that restoration or protection is in-effective due to there being no alternate path;
    receiving a first client signal failure clear signal indicating that the failure within the first path has been resolved such that the first path can be considered for carrying data traffic;
    initiating an optical switch ramp process by a second controller of the first node for an optical switch of the first node in which power levels within the optical switch are increased from a first power level at a first instant of time to a second power level at a second instant of time, the second power level being greater than the first power level, and the second power level of the optical signals being sufficient to carry data traffic in an optical fiber from the first node to a second node downstream from the first node and within the first path;
    receiving, by circuitry of the first controller of the first node, a second signal from the second controller indicating that the optical ramp switch process has increased the power level of the optical signals to the second power level; and
    passing a second client signal failure clear signal to the second node after the first controller of the first node received the second signal from the second controller.

2. The method of claim 1, wherein the first controller is an optical supervisory channel controller.

3. The method of claim 1, wherein the first signal is selected from a group consisting of a forward defect indication signal, an open connection indication signal and a lock signal.

4. The method of claim 1, wherein the first client signal failure clear signal is indicative of a failure at the source.

5. The method of claim 1, wherein the second controller is a wavelength selective switch controller.

6. The method of claim 1, wherein the second signal is indicative of clearance of the first signal.

7. The method of claim 6, wherein the second controller is a wavelength selective switch controller.

8. A method comprising the steps of:
    receiving, by circuitry of a first controller of a first node on a first path within a transport network, a first signal indicating a failure within the first path, and a client signal failure indicating that restoration or protection is in-effective due to there being no alternate path;
    receiving a first client signal failure clear signal indicating that the failure within the first path has been resolved such that the first path can be considered for carrying data traffic;

initiating an optical switch ramp process by a second controller of the first node for an optical switch of the first node in which power levels within the optical switch are increased from a first power level at a first instant of time to a second power level at a second instant of time, the second power level being greater than the first power level, and the second power level of the optical signals being sufficient to carry data traffic in an optical fiber from the first node to a second node downstream from the first node and within the first path;

after a predetermined time period from initiation of the optical switch ramp process, passing a second client signal failure clear signal to the second node.

9. The method of claim 8, wherein the first controller is an optical supervisory channel controller.

10. The method of claim 8, wherein the first signal is selected from a group consisting of a forward defect indication signal, an open connection indication signal and a lock signal.

11. The method of claim 8, wherein the first client signal failure clear signal is indicative of a failure at the source.

12. The method of claim 8, wherein the second controller is a wavelength selective switch controller.

13. The method of claim 8, wherein the second client signal failure clearance signal is indicative of clearance of the first signal.

14. The method of claim 13, wherein the second controller is a wavelength selective switch controller.

15. A method, comprising:
receiving by circuitry of a first controller of a first node, a first signal indicating an optical loss of signal within a first path within a transport network;
generating, by circuitry of a second controller of the first node on the first path, a second signal indicating a failure within the first path,
determining, by the first controller accessing a network topology database, that restoration of the first path would be ineffective due to there being no alternate path; and
signaling a second node downstream in the first path with the second signal indicating the failure within the first path, and a third signal indicating that restoration of the first path would be ineffective due to there being no alternate path.

16. The method of claim 15, wherein the second controller is a wavelength selective switch controller.

17. The method of claim 15, wherein the second signal is selected from a group consisting of a forward defect indication signal, an open connection indication signal and a lock signal.

18. The method of claim 15, wherein the third signal is indicative of a failure at the source.

19. The method of claim 15, wherein the first controller is an optical supervisory channel controller.

20. The method of claim 15, wherein signaling the second node downstream includes encoding the second signal and the third signal into an optical supervisory channel on a fiber optic link that is outside of any data traffic carrying channels on the fiber optic link.

21. A method, comprising:
receiving by circuitry of a first controller of the first node, a first signal indicating an optical loss of signal at a source within the first path;
receiving by circuitry of the first controller of the first node, a second signal indicating a presence of an optical signal at the source within the first path, thereby rectifying the optical loss of signal at the source within the first path;
signaling a second node downstream in the first path with a third signal indicating clearance of a failure at the source within the first path after a passage of a predetermined amount of time, the predetermined amount of time being an expected amount of time for an optical switch at the first node to complete a ramp process in which power levels within the optical switch are increased from a first power level at a first instant of time to a second power level at a second instant of time, the second power level being greater than the first power level, and the second power level of the optical signals being sufficient to carry data traffic in an optical fiber from the first node to a second node downstream from the first node and within the first path.

22. The method of claim 21, wherein the first controller is an optical supervisory channel controller.

23. The method of claim 22, wherein signaling the second node downstream includes encoding the third signal into an optical supervisory channel on a fiber optic link that is outside of any data traffic carrying channels on the fiber optic link.

* * * * *